(12) United States Patent
Riege et al.

(10) Patent No.: US 8,188,575 B2
(45) Date of Patent: May 29, 2012

(54) APPARATUS AND METHOD FOR UNIFORM METAL PLATING

(75) Inventors: Jens A. Riege, Ojai, CA (US); Heather L. Knoedler, Newbury Park, CA (US); Shiban K. Tiku, Camarillo, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 88 days.

(21) Appl. No.: 12/898,622

(22) Filed: Oct. 5, 2010

(65) Prior Publication Data
US 2012/0080790 A1    Apr. 5, 2012

(51) Int. Cl.
*H01L 23/544* (2006.01)
(52) U.S. Cl. ........... 257/620; 257/E23.179; 257/750; 438/694; 438/702; 427/171; 427/248.1
(58) Field of Classification Search ........... 257/E23.179, 257/620, 750; 438/16, 113, 458, 462, 694, 438/702, 714, 716, 762, 795, 905; 427/58, 427/171, 248.1, 299, 569; 414/153, 220, 414/935, 941
See application file for complete search history.

(56) References Cited

U.S. PATENT DOCUMENTS

| | | | | |
|---|---|---|---|---|
| 5,503,881 | A | * | 4/1996 | Cain et al. ............... 438/716 |
| 5,959,409 | A | * | 9/1999 | Dornfest et al. ......... 315/111.21 |
| 6,050,216 | A | * | 4/2000 | Szapucki et al. ......... 118/723 E |
| 6,170,432 | B1 | * | 1/2001 | Szapucki et al. ......... 118/723 E |
| 6,237,528 | B1 | * | 5/2001 | Szapucki et al. ......... 118/723 E |
| 6,911,779 | B2 | * | 6/2005 | Madocks ................. 315/111.21 |
| 7,159,599 | B2 | * | 1/2007 | Verhaverbeke et al. ...... 134/109 |
| 7,879,409 | B2 | * | 2/2011 | Furuta et al. ................ 427/489 |
| 7,932,678 | B2 | * | 4/2011 | Madocks ................. 315/111.21 |
| 8,039,052 | B2 | * | 10/2011 | Endo et al. ................ 427/248.1 |

* cited by examiner

*Primary Examiner* — Chris Chu
(74) *Attorney, Agent, or Firm* — Knobbe, Martens, Olson & Bear LLP

(57) ABSTRACT

Apparatus and methods for uniform metal plating onto a semiconductor wafer, such as GaAs wafer, are disclosed. One such apparatus can include an anode and a showerhead body. The anode can include an anode post and a showerhead anode plate. The showerhead anode plate can include holes sized to dispense a particular plating solution, such as plating solution that includes gold, onto a wafer. The showerhead body can be coupled to the anode post and the showerhead anode plate. The showerhead body can be configured to create a seal sufficient to substantially prevent a reduction of pressure in the plating solution flowing from the anode post to holes of the showerhead anode plate.

26 Claims, 13 Drawing Sheets

APPARATUS AND METHOD FOR UNIFORM METAL PLATING

BACKGROUND

1. Field

The disclosed technology relates to systems that can process semiconductor substrates and, in particular, to systems for uniform metal plating.

2. Description of the Related Art

Processing of a semiconductor substrate, such as GaAs wafer, may include plating a metal layer, such as gold, over the semiconductor substrate. The metal layer may be applied over one or more features of the substrate, such as a via. It can be important for the plated metal layer to be uniformly applied over the features of the substrate. For example, a uniformly plated metal layer can have reduced resistance and inductance relative to a metal layer having a varying thickness.

The substrate to be plated may operate as a cathode of a plating circuit, and an anode of the plating circuit may include a metal to be plated on the substrate. The anode and the cathode may be immersed in a solution that can include one or more dissolved metals, along with other ions that may permit the flow of electricity. A power supply can supply a current to the anode, which may oxidize the metal atoms and allow the metal atoms to dissolve in the solution. The dissolved atoms may be reduced where the solution meets the cathode, such that they plate the cathode.

As wafer size increases, issues associated with plating a uniform metal layer over features in various positions across a major surface of a substrate may become exacerbated. Moreover, the time required for plating may increase for larger wafers, slowing down the overall process flow. Accordingly, there exists a need for improved apparatus and methods for uniform metal plating.

SUMMARY OF CERTAIN INVENTIVE ASPECTS

The apparatus, methods, and wafers described in the claims each have several aspects, no single one of which is solely responsible for its desirable attributes. Without limiting the scope of this invention, some prominent features will now be briefly discussed.

One aspect of the disclosure is an apparatus for plating one or more features of a GaAs wafer with gold. The apparatus includes an anode and a showerhead body coupled to the anode. The anode includes an anode post and a showerhead anode plate. The anode post has at least one opening for providing a gold plating solution, and the showerhead anode plate has holes sized to dispense the gold plating solution onto the GaAs wafer. The showerhead body is coupled to the anode post and the showerhead anode plate. In addition, the showerhead body is configured to create a seal sufficient to substantially prevent a reduction of pressure in the gold plating solution flowing from the anode post and the holes of the showerhead anode plate.

In a number of implementations, the apparatus also includes a rotatable substrate holder configured to hold a substrate substantially parallel to a major surface of the showerhead anode plate. In some of these implementations, the substrate includes a sapphire carrier bonded to the GaAs wafer, and the substrate holder is configured to hold the sapphire carrier. According to various implementations, the rotatable wafer holder is configured to rotate at a rate of at least one rotation per second and to reverse a direction of rotation at a predetermined interval of time during plating.

According to some implementations, the holes of the showerhead anode plate are configured to dispense the plating solution at a flow rate of at least about 6 gallons per minute. In accordance with a number of implementations, the holes of the showerhead anode plate are sized for dispensing the plating solution onto the GaAs wafer having a diameter of at least about 150 mm. In some implementations, the showerhead anode plate has a diameter of at least about 150 mm.

According to a number of implementations the showerhead body includes polypropylene. In accordance with some implementations, the showerhead anode plate comprises platinum and titanium. In various implementations, the showerhead body has a diameter that increases from a point at which the showerhead body contacts the anode post to another point at which the showerhead body contacts the showerhead anode plate.

Another aspect of the disclosure is a method of plating one or more features on a GaAs wafer. The method includes providing a showerhead body coupled to an anode post, the anode post having an opening at a first end that opens into the showerhead body. The method includes providing a showerhead anode plate coupled to the showerhead body, the showerhead anode plate having holes configured to dispense a plating solution, and the showerhead anode plate electrically coupled to the anode post. The method also includes electrically charging a cathode that includes the GaAs wafer. Additionally, the method includes plating the one or more features of the GaAs wafer with gold dispensed from the holes of the showerhead anode plate.

In some implementations, at least one of the one or more features has a depth that is at least about five times the width at the narrowest point of the at least one feature. In a number of implementations, the at least one of the one or more features includes a through-wafer via. According to various implementations, at least one of the one or more features has a depth of at least about 50 microns. In accordance with certain implementations, the GaAs wafer has a diameter of at least about 150 mm.

According to some implementations, the showerhead anode plate includes holes arranged in a cross pattern. In a various implementations, the plating includes plating features having a depth of least about 50 microns on a wafer that is at least about 150 mm in diameter to a backside plating thickness uniformity of within approximately 4%. In accordance with a number of implementations, the method also includes rotating the GaAs wafer at a rate of at least one rotation per second during the plating. According to some implementations, the plating solution flows through the holes in the showerhead anode plate at a flow rate of at least about 7.5 gallons per minute.

One more aspect of the disclosure is a method of plating one or more through-wafer vias on a GaAs wafer having a diameter of at least about 150 mm. The method includes: dispensing a plating solution that includes gold through a plurality of holes of a showerhead anode plate, the plurality of holes arranged in a cross shape and sized for dispensing gold onto the GaAs wafer; and forming a uniform layer of gold over the one or more through-wafer vias, the uniform layer of gold having a thickness of at least about 1.5 um and a backside plating thickness uniformity within about 4%.

In some implementations, the showerhead anode plate comprises platinum and titanium. According to a number of implementations, the uniform layer of gold is formed over at least one seed layer. In accordance with various implementations, the plurality of holes includes a hole in the center of the showerhead anode plate and at least 8 more holes arranged in a cross shape on the showerhead anode plate.

Yet another aspect of the disclosure is a GaAs wafer. The GaAs wafer includes a circular major surface having a diameter of at least about 150 mm, and a layer of gold formed over features of the GaAs wafer to a backside plating thickness uniformity within about 4%. A plating uniformity pattern of the GaAs wafer includes concentric rings around the GaAs wafer having a different characteristic than the remaining uniformity pattern of the GaAs wafer.

In some implementations, the features include through-wafer vias. According to a number of implementations, the concentric rings have a different resistance compared to the remaining portion of the GaAs wafer.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The headings provided herein, if any, are for convenience only and do not necessarily affect the scope or meaning of the claimed invention.

Figure 1:
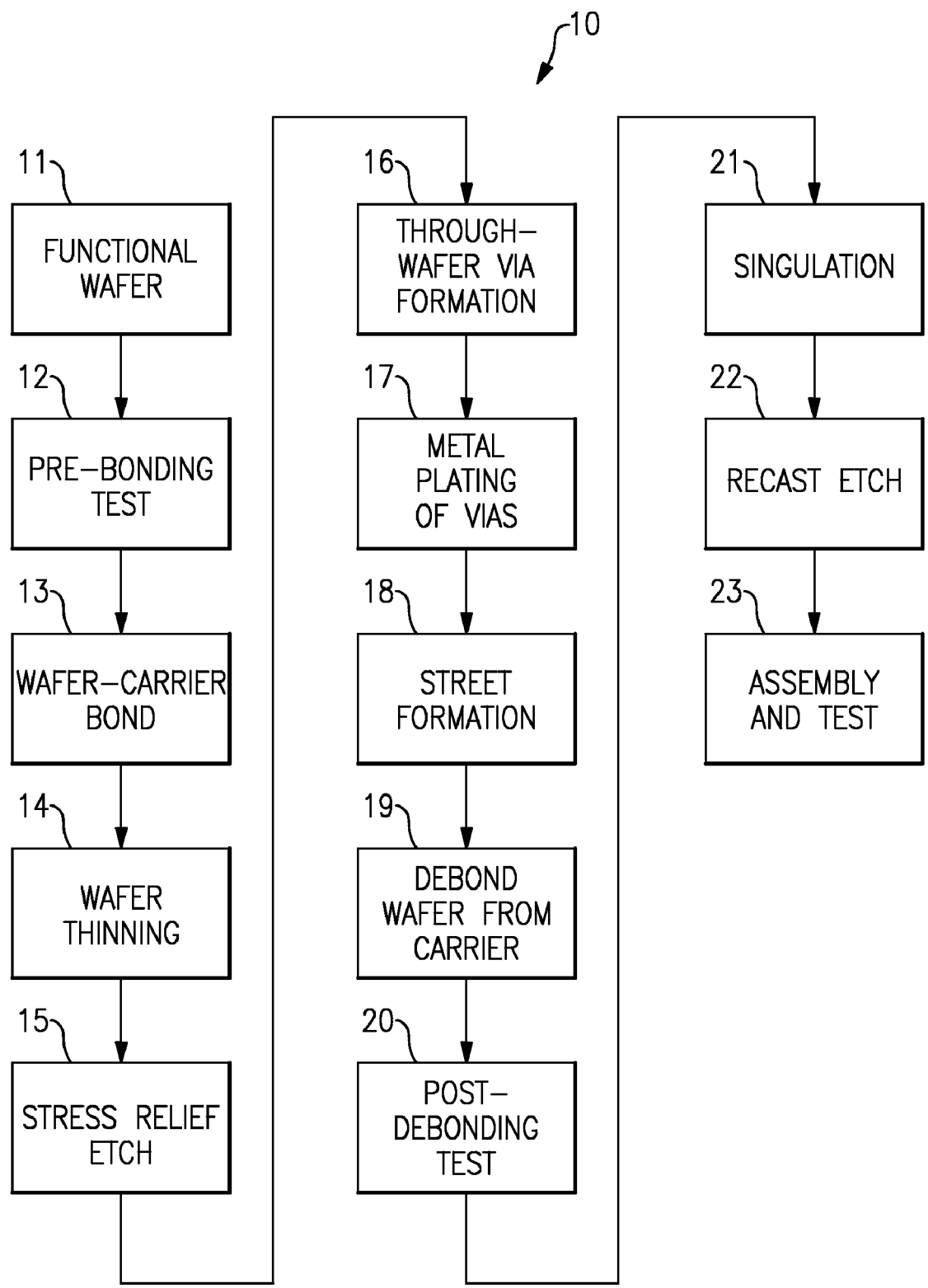
FIG. 1 shows an example sequence of wafer processing for forming through-wafer features such as vias.

Provided herein are various methodologies and devices for processing wafers such as semiconductor wafers. FIG. 1 shows an example of a process 10 where a functional wafer is further processed to form through-wafer features such as vias and back-side metal layers. As further shown in FIG. 1, the example process 10 can include bonding of a wafer to a carrier for support and/or to facilitate handling during the various steps of the process, and debonding of the wafer from the carrier upon completion of such steps. FIG. 1 further shows that such a wafer separated from the carrier can be further processed so as to yield a number of dies.

In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

In the description herein, various examples are described in the context of back-side processing of wafers. It will be understood, however, that some or all of the features of the present disclosure can be implemented in front-side processing of wafers.

Figure 2A:
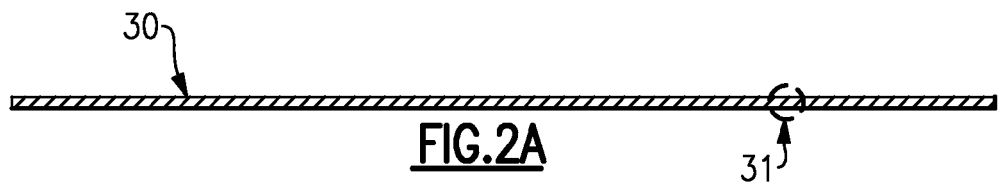
FIGS. 2A-2V show examples of structures at various stages of the processing sequence of FIG. 1.

In the process 10 of FIG. 1, a functional wafer can be provided (block 11). FIG. 2A depicts a side view of such a wafer 30 having first and second sides. The first side can be a front side, and the second side a back side.

Figure 2B:
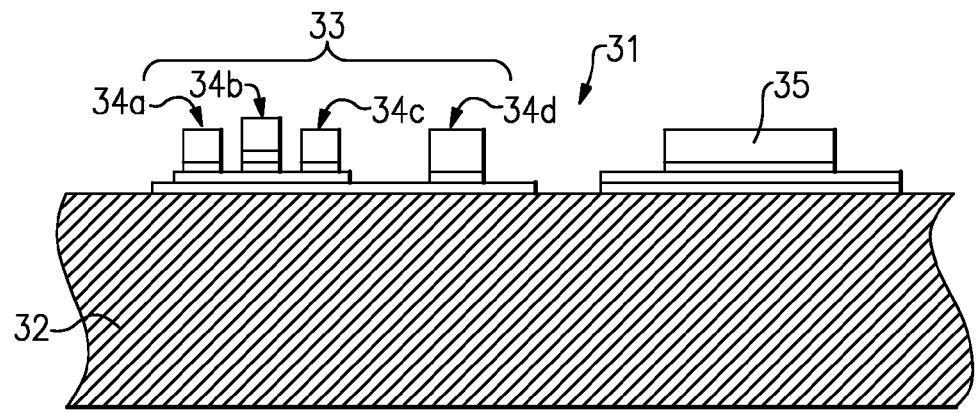

FIG. 2B depicts an enlarged view of a portion 31 of the wafer 30. The wafer 30 can include a substrate layer 32 (e.g., a GaAs substrate layer). The wafer 30 can further include a number of features formed on or in its front side. In the example shown, a transistor 33 and a metal pad 35 are depicted as being formed the front side. The example transistor 33 is depicted as having an emitter 34b, bases 34a, 34c, and a collector 34d. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Referring to the process 10 of FIG. 1, the functional wafer of block 11 can be tested (block 12) in a number of ways prior to bonding. Such a pre-bonding test can include, for example, DC and RF tests associated with process control parameters.

Figure 2C:
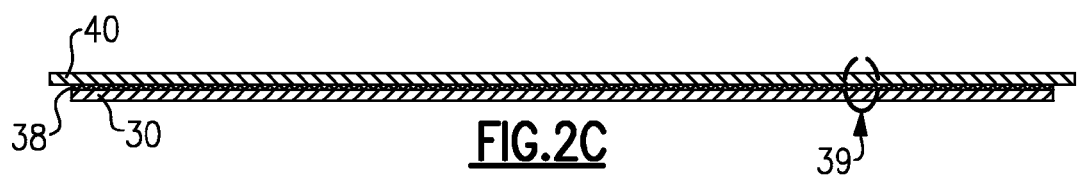

Upon such testing, the wafer can be bonded to a carrier (block 13). In certain implementations, such a bonding can be achieved with the carrier above the wafer. Thus, FIG. 2C shows an example assembly of the wafer 30 and a carrier 40 (above the wafer) that can result from the bonding step 13. In certain implementations, the wafer and carrier can be bonded using temporary mounting adhesives such as wax or commercially available Crystalbond™. In FIG. 2C, such an adhesive is depicted as an adhesive layer 38.

In certain implementations, the carrier 40 can be a plate having a shape (e.g., circular) similar to the wafer it is supporting. Preferably, the carrier plate 40 has certain physical properties. For example, the carrier plate 40 can be relatively rigid for providing structural support for the wafer. In another example, the carrier plate 40 can be resistant to a number of chemicals and environments associated with various wafer processes. In another example, the carrier plate 40 can have certain desirable optical properties to facilitate a number of processes (e.g., transparency to accommodate optical alignment and inspections)

Materials having some or all of the foregoing properties can include sapphire, borosilicate (also referred to as Pyrex), quartz, and glass (e.g., SCG72).

In certain implementations, the carrier plate 40 can be dimensioned to be larger than the wafer 30. Thus, for circular wafers, a carrier plate can also have a circular shape with a diameter that is greater than the diameter of a wafer it supports. Such a larger dimension of the carrier plate can facilitate easier handling of the mounted wafer, and thus can allow more efficient processing of areas at or near the periphery of the wafer.

Tables 1A and 1B list various example ranges of dimensions and example dimensions of some example circular-shaped carrier plates that can be utilized in the process 10 of FIG. 1.

TABLE 1A

| Carrier plate diameter range | Carrier plate thickness range | Wafer size |
| --- | --- | --- |
| Approx. 100 to 120 mm | Approx. 500 to 1500 um | Approx. 100 mm |
| Approx. 150 to 170 mm | Approx. 500 to 1500 um | Approx. 150 mm |
| Approx. 200 to 220 mm | Approx. 500 to 2000 um | Approx. 200 mm |
| Approx. 300 to 320 mm | Approx. 500 to 3000 um | Approx. 300 mm |

TABLE 1B

| Carrier plate diameter | Carrier plate thickness | Wafer size |
| --- | --- | --- |
| Approx. 110 mm | Approx. 1000 um | Approx. 100 mm |
| Approx. 160 mm | Approx. 1300 um | Approx. 150 mm |
| Approx. 210 mm | Approx. 1600 um | Approx. 200 mm |
| Approx. 310 mm | Approx. 1900 um | Approx. 300 mm |

Figure 2D:
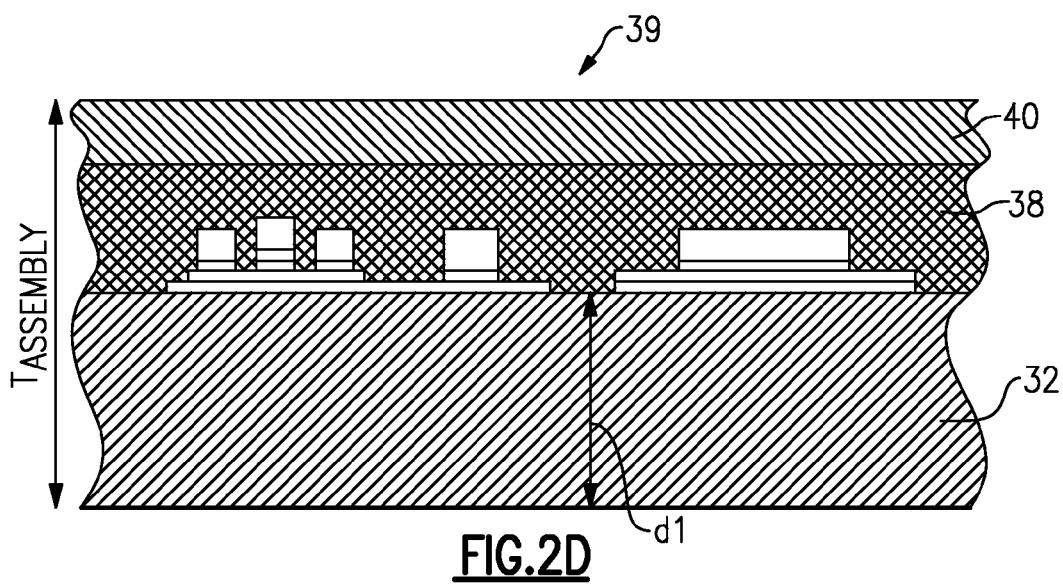

An enlarged portion 39 of the bonded assembly in FIG. 2C is depicted in FIG. 2D. The bonded assembly can include the GaAs substrate layer 32 on which are a number of devices such as the transistor (33) and metal pad (35) as described in reference to FIG. 2B. The wafer (30) having such substrate (32) and devices (e.g., 33, 35) is depicted as being bonded to the carrier plate 40 via the adhesive layer 38.

As shown in FIG. 2D, the substrate layer 32 at this stage has a thickness of d1, and the carrier plate 40 has a generally fixed thickness (e.g., one of the thicknesses in Table 1). Thus, the overall thickness ($T_{assembly}$) of the bonded assembly can be determined by the amount of adhesive in the layer 38.

In a number of processing situations, it is preferable to provide sufficient amount of adhesive to cover the tallest feature(s) so as to yield a more uniform adhesion between the wafer and the carrier plate, and also so that such a tall feature does not directly engage the carrier plate. Thus, in the example shown in FIG. 2D, the emitter feature (34b in FIG. 2B) is the tallest among the example features; and the adhesive layer 38 is sufficiently thick to cover such a feature and provide a relatively uninterrupted adhesion between the wafer 30 and the carrier plate 40.

Figure 2E:
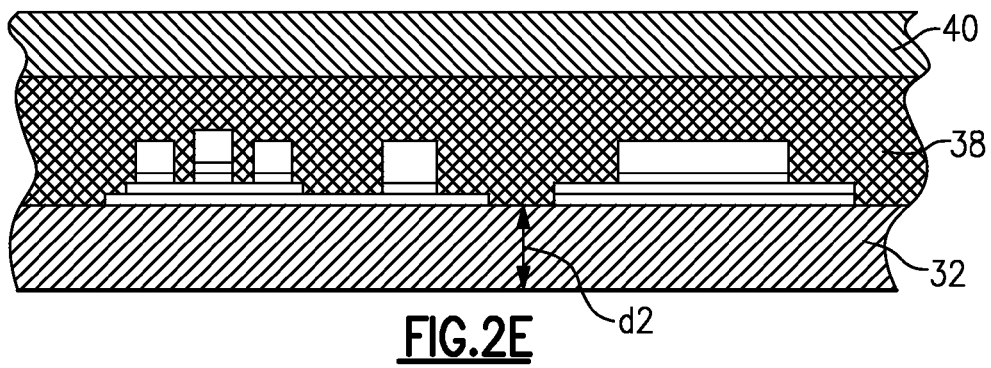

Referring to the process 10 of FIG. 1, the wafer—now mounted to the carrier plate—can be thinned so as to yield a desired substrate thickness in blocks 14 and 15. In block 14, the back side of the substrate 32 can be ground away (e.g., via a two-step grind with coarse and fine diamond-embedded grinding wheels) so as to yield an intermediate thickness-substrate (with thickness d2 as shown in FIG. 2E) with a relatively rough surface. In certain implementations, such a grinding process can be performed with the bottom surface of the substrate facing downward.

In block 15, the relatively rough surface can be removed so as to yield a smoother back surface for the substrate 32. In certain implementations, such removal of the rough substrate surface can be achieved by an O2 plasma ash process, followed by a wet etch process utilizing acid or base chemistry. Such an acid or base chemistry can include HCl, $H_2SO_4$, $HNO_3$, $H_3PO_4$, $H_3COOH$, $NH_4OH$, $H_2O_2$, etc., mixed with $H_2O$ and/or $H_2O$. Such an etching process can provide relief from possible stress on the wafer due to the rough ground surface.

Figure 2F:
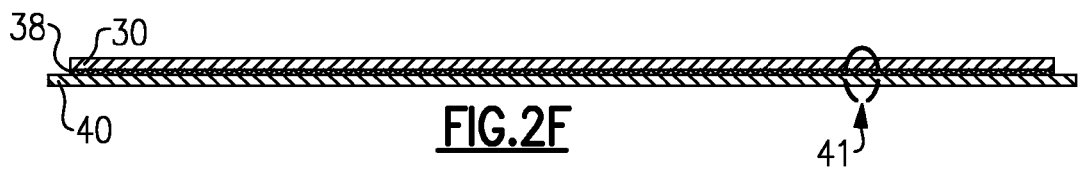
Figure 2G:
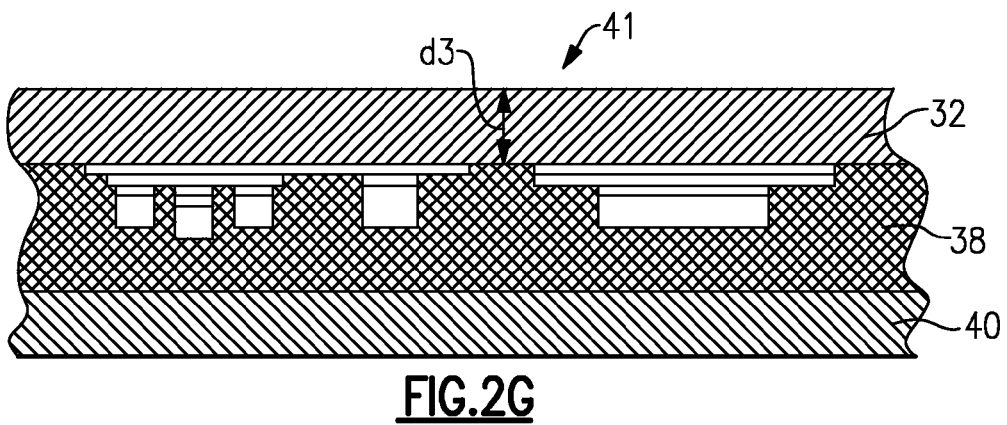

In certain implementations, the foregoing plasma ash and wet etch processes can be performed with the back side of the substrate 32 facing upward. Accordingly, the bonded assembly in FIG. 2F depicts the wafer 30 above the carrier plate 40. FIG. 2G shows the substrate layer 32 with a thinned and smoothed surface, and a corresponding thickness of d3.

By way of an example, the pre-grinding thickness (d1 in FIG. 2D) of a 150 mm (also referred to as "6-inch") GaAs substrate can range from approximately 600 μm to 800 μm. The thickness d2 (FIG. 2E) resulting from the grinding process range from approximately 50 μm to 200 μm. The ash and etching processes remove approximately 5 μm to 10 μm of the rough surface (d3 in FIG. 2G). Other thicknesses are possible.

In certain situations, a desired thickness of the back-side-surface-smoothed substrate layer can be an important design parameter. Accordingly, it is desirable to be able to monitor the thinning (block 14) and stress relief (block 15) processes. Since it can be difficult to measure the substrate layer while the wafer is bonded to the carrier plate and being worked on, the thickness of the bonded assembly can be measured so as to allow extrapolation of the substrate layer thickness. Such a measurement can be achieved by, for example, a gas (e.g., air) back pressure measurement system that allows detection of surfaces (e.g., back side of the substrate and the "front" surface of the carrier plate) without contact.

As described in reference to FIG. 2D, the thickness ($T_{assembly}$) of the bonded assembly can be measured; and the thicknesses of the carrier plate 40 and the un-thinned substrate 32 can have known values. Thus, subsequent thinning of the bonded assembly can be attributed to the thinning of the substrate 32; and the thickness of the substrate 32 can be estimated.

Figure 2H:
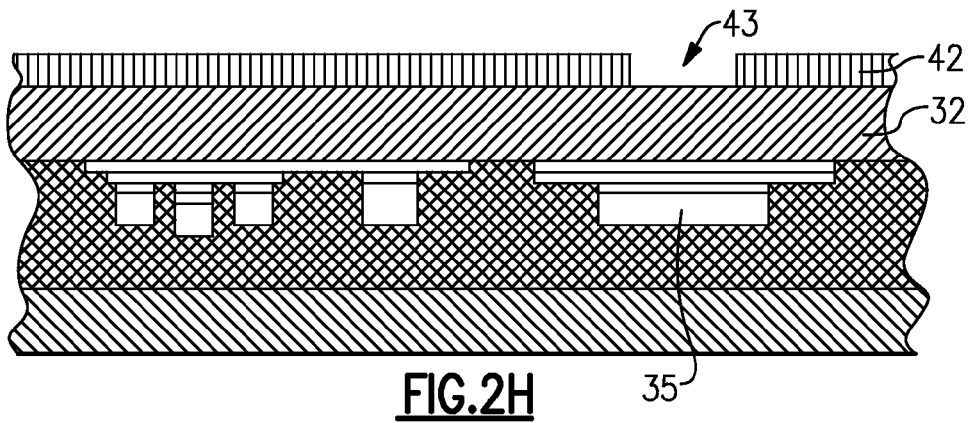
Figure 2I:
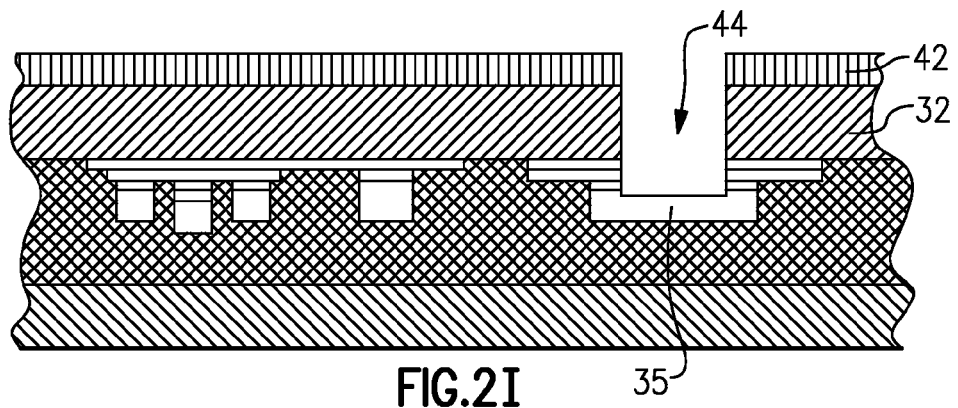
Figure 2J:
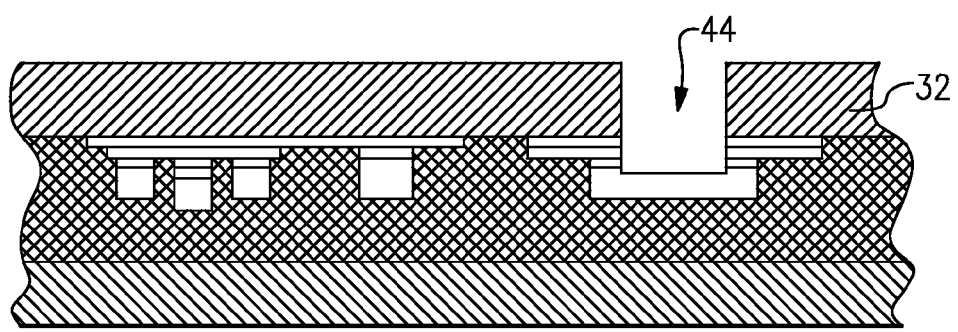

Referring to the process 10 of FIG. 1, the thinned and stress-relieved wafer can undergo a through-wafer via formation process (block 16). FIGS. 2H-2J show different stages during the formation of a via 44. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side.

To form an etch resist layer 42 that defines an etching opening 43 (FIG. 2H), photolithography can be utilized. Coating of a resist material on the back surface of the substrate, exposure of a mask pattern, and developing of the exposed resist coat can be achieved in known manners. In the example configuration of FIG. 2H, the resist layer 42 can have a thickness ranging from about 12 μm to 24 μm.

To form a through-wafer via 44 (FIG. 2I) from the back surface of the substrate to the metal pad 35, techniques such as dry inductively coupled plasma (ICP) etching (with chemistry such as $BCl_3/Cl_2$) can be utilized. In various implementations, a desired shaped via can be an important design parameter for facilitating proper metal coverage therein in subsequent processes.

FIG. 2J shows the formed via 44, with the resist layer 42 removed. To remove the resist layer 42, photoresist strip solvents such as NMP (N-methyl-2-pyrrolidone) and EKC can be applied using, for example, a batch spray tool. In various implementations, proper removal of the resist material 42 from the substrate surface can be an important consideration for subsequent metal adhesion. To remove residue of the resist material that may remain after the solvent strip process, a plasma ash (e.g., $O_2$) process can be applied to the back side of the wafer.

Figure 2K:
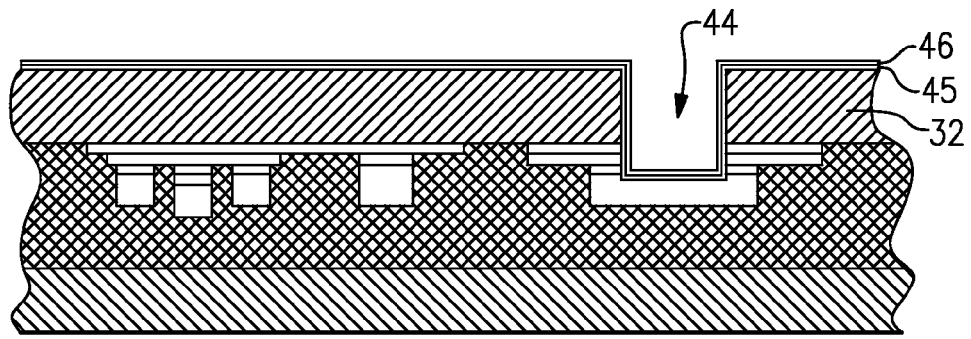
Figure 2L:
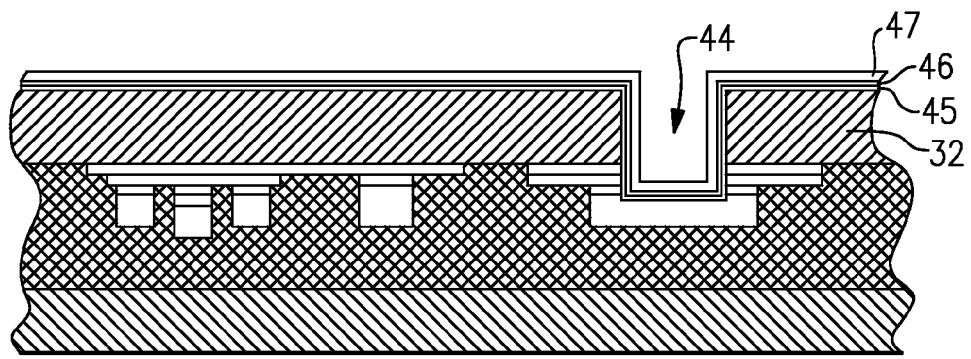

Referring to the process 10 of FIG. 1, a metal layer can be formed on the back surface of the substrate 32 in block 17. FIGS. 2K and 2L show examples of adhesion/seed layers and a thicker metal layer.

FIG. 2K shows that in certain implementations, an adhesion layer 45 such as a nickel vanadium (NiV) layer can be formed on surfaces of the substrate's back side and the via 44 by, for example, sputtering. Preferably, the surfaces are cleaned (e.g., with HCl) prior to the application of NiV. FIG. 2K also shows that a seed layer 46 such as a thin gold layer can be formed on the adhesion layer 45 by, for example, sputtering. Such a seed layer facilitates formation of a thick metal layer 47 such as a thick gold layer shown in FIG. 2L. In certain implementations, the thick gold layer can be formed by a plating technique.

In certain implementations, the gold plating process can be performed after a pre-plating cleaning process (e.g., $O_2$ plasma ash and HCl cleaning). The plating can be performed to form a gold layer of about 3 μm to 6 μm to facilitate the foregoing electrical connectivity and heat transfer functionalities. The plated surface can undergo a post-plating cleaning process (e.g., $O_2$ plasma ash).

The metal layer formed in the foregoing manner forms a back side metal plane that is electrically connected to the metal pad 35 on the front side. Such a connection can provide a robust electrical reference (e.g., ground potential) for the metal pad 35. Such a connection can also provide an efficient pathway for conduction of heat between the back side metal plane and the metal pad 35.

Thus, one can see that the integrity of the metal layer in the via 44 and how it is connected to the metal pad 35 and the back side metal plane can be important factors for the performance of various devices on the wafer. Accordingly, it is desirable to have the metal layer formation be implemented in an effective manner. More particularly, it is desirable to provide an effective metal layer formation in features such as vias that may be less accessible.

Figure 2M:
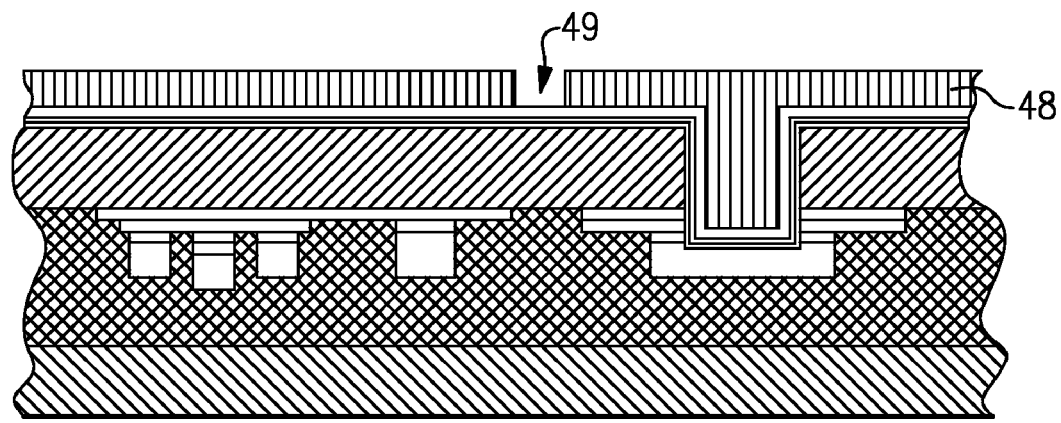
Figure 2N:
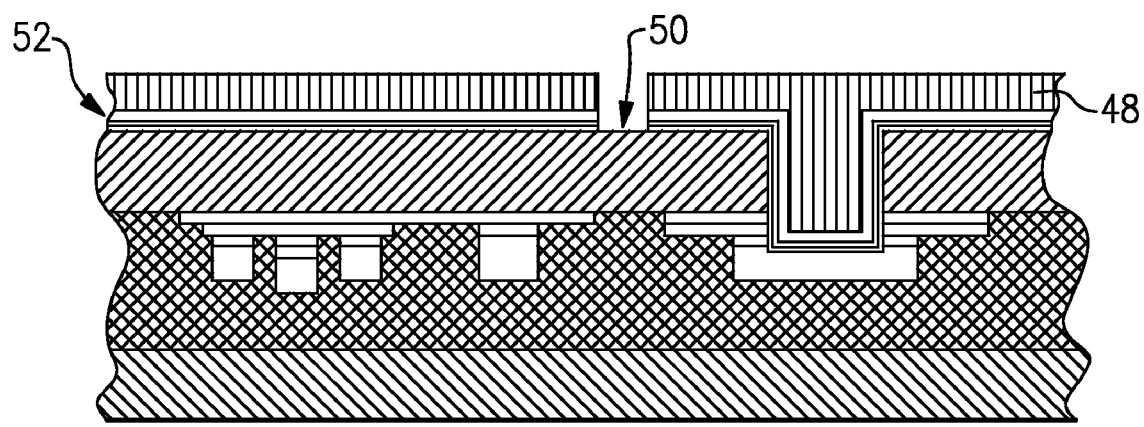
Figure 2O:
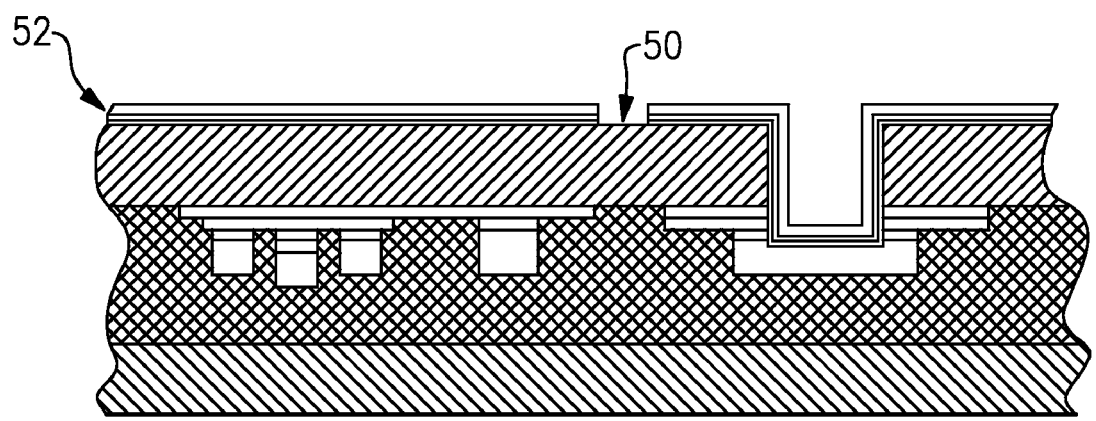

Referring to the process 10 of FIG. 1, the wafer having a metal layer formed on its back side can undergo a street formation process (block 18). FIGS. 2M-2O show different stages during the formation of a street 50. Such a street is described herein as being formed from the back side of the wafer and extending through the metal layer 52 to facilitate subsequent singulation of dies. It will be understood that one or more features described herein can also be implemented for other street-like features on or near the back surface of the wafer. Moreover, other street-like features can be formed for purposes other than to facilitate the singulation process.

To form an etch resist layer 48 that defines an etching opening 49 (FIG. 2M), photolithography can be utilized. Coating of a resist material on the back surface of the substrate, exposure of a mask pattern, and developing of the exposed resist coat can be achieved in known manners.

To form a street 50 (FIG. 2N) through the metal layer 52, techniques such as wet etching (with chemistry such as potassium iodide) can be utilized. A pre-etching cleaning process (e.g., $O_2$ plasma ash) can be performed prior to the etching process. In various implementations, the thickness of the resist 48 and how such a resist is applied to the back side of the wafer can be important considerations to prevent certain undesirable effects, such as via rings and undesired etching of via rim during the etch process.

FIG. 2O shows the formed street 50, with the resist layer 48 removed. To remove the resist layer 48, photoresist strip solvents such as NMP (N-methyl-2-pyrrolidone) can be applied using, for example, a batch spray tool. To remove residue of the resist material that may remain after the solvent strip process, a plasma ash (e.g., $O_2$) process can be applied to the back side of the wafer.

In the example back-side wafer process described in reference to FIGS. 1 and 2, the street (50) formation and removal of the resist (48) yields a wafer that no longer needs to be mounted to a carrier plate. Thus, referring to the process 10 of FIG. 1, the wafer is debonded or separated from the carrier plate in block 19. FIGS. 2P-2R show different stages of the separation and cleaning of the wafer 30.

Figure 2P:
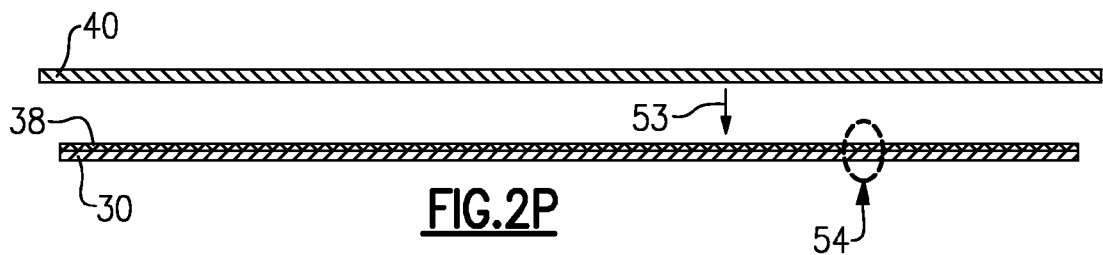

In certain implementations, separation of the wafer 30 from the carrier plate 40 can be performed with the wafer 30 below the carrier plate 40 (FIG. 2P). To separate the wafer 30 from the carrier plate 40, the adhesive layer 38 can be heated to reduce the bonding property of the adhesive. For the example Crystalbond™ adhesive, an elevated temperature ranging from about 135° C. to 180° C. can melt the adhesive to facilitate an easier separation of the wafer 30 from the carrier plate 40. Some form of mechanical force can be applied to the wafer 30, the carrier plate 40, or some combination thereof, to achieve such separation (arrow 53 in FIG. 2P). In various implementations, achieving such a separation of the wafer with reduced likelihood of scratches and cracks on the wafer can be an important process parameter for facilitating a high yield of good dies.

Figure 2Q:
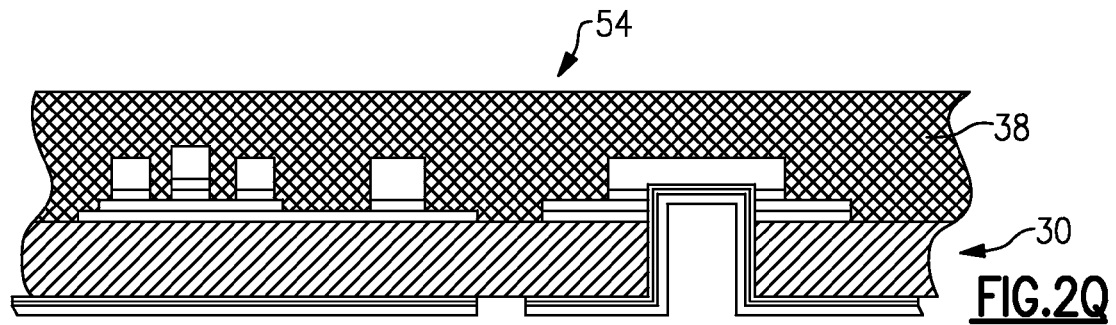

In FIGS. 2P and 2Q, the adhesive layer 38 is depicted as remaining with the wafer 30 instead of the carrier plate 40. It will be understood that some adhesive may remain with the carrier plate 40.

Figure 2R:
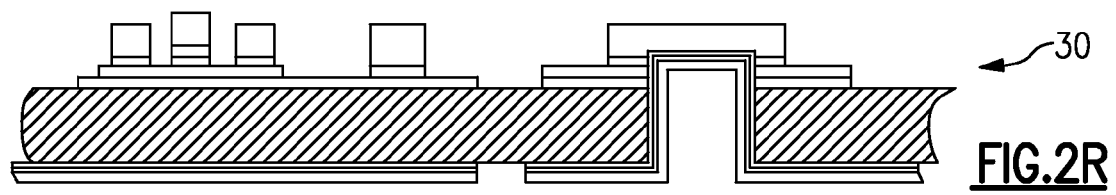

FIG. 2R shows the adhesive 38 removed from the front side of the wafer 30. The adhesive can be removed by a cleaning solution (e.g., acetone), and remaining residues can be further removed by, for example, a plasma ash (e.g., $O_2$) process.

Referring to the process 10 of FIG. 1, the debonded wafer of block 19 can be tested (block 20) in a number of ways prior to singulation. Such a post-debonding test can include, for example, resistance of the metal interconnect formed on the through-wafer via using process control parameters on the front side of the wafer. Other tests can address quality control associated with various processes, such as quality of the through-wafer via etch, seed layer deposition, and gold plating.

Figure 2S:
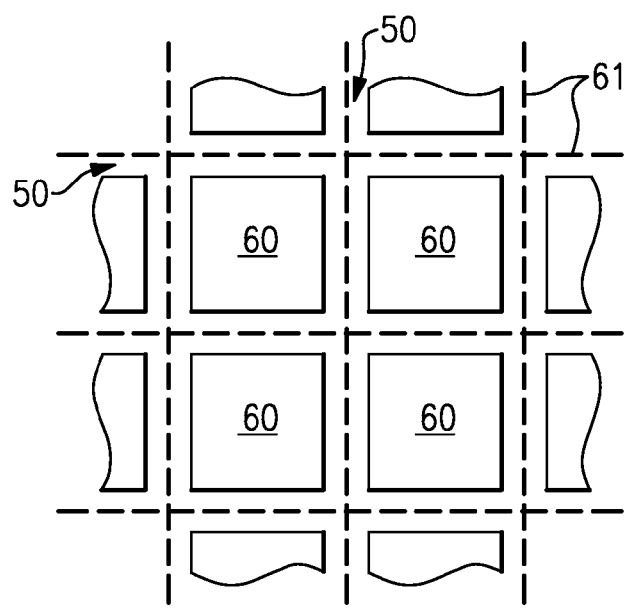

Referring to the process 10 of FIG. 1, the tested wafer can be cut to yield a number of dies (block 21). In certain implementations, at least some of the streets (50) formed in block 18 can facilitate the cutting process. FIG. 2S shows cuts 61 being made along the streets 50 so as to separate an array of dies 60 into individual dies. Such a cutting process can be achieved by, for example, a diamond scribe and roller break, saw or a laser.

Figure 2T:
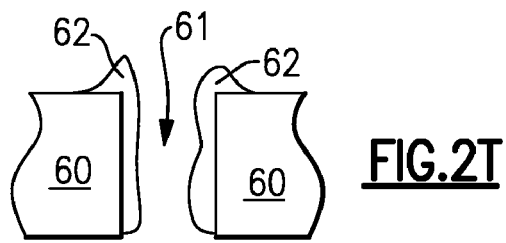

In the context of laser cutting, FIG. 2T shows an effect on the edges of adjacent dies 60 cut by a laser. As the laser makes the cut 61, a rough edge feature 62 (commonly referred to as recast) typically forms. Presence of such a recast can increase the likelihood of formation of a crack therein and propagating into the functional part of the corresponding die.

Figure 2U:
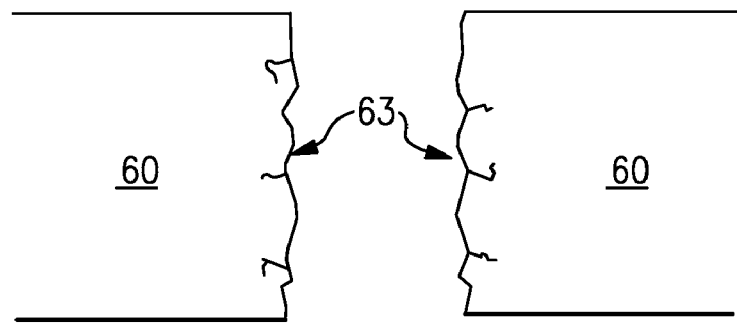
Figure 2V:
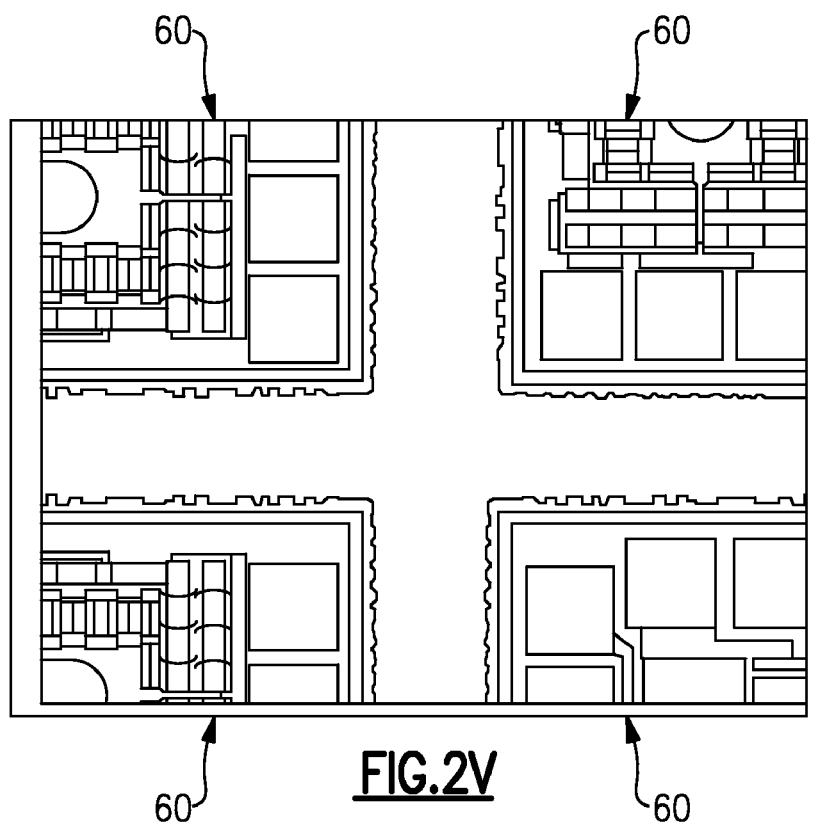

Thus, referring to the process 10 in FIG. 1, a recast etch process using acid and/or base chemistry (e.g., similar to the examples described in reference to block 15) can be performed in block 22. Such etching of the recast feature 62 and defects formed by the recast, increases the die strength and reduces the likelihood of die crack failures (FIG. 2U).

Referring to the process 10 of FIG. 1, the recast etched dies (FIG. 2V) can be further inspected and subsequently be packaged.

Overview of Metal Plating

During processing of a semiconductor substrate, such as a GaAs wafer, a uniform metal layer may be plated over the semiconductor substrate. This may provide a uniform metal layer over one or more features, such as a via, of the semiconductor substrate. The process of plating may be referred to as "electroplating" and/or "electrodeposition." The plating process may be analogous to a galvanic cell acting in reverse. The substrate may operate as a cathode of a plating circuit, and an anode of the plating circuit may include a metal to be plated on the substrate. The anode and the cathode may be immersed in a solution that can include one or more dissolved metals, along with other ions that may permit the flow of electricity. The cathode may be rotated about the axis of the anode post during plating. A power supply can supply a current to the anode. The dissolved metal atoms in the plating solution may be reduced where the solution meets the cathode, such that they plate the cathode. The rate at which the metal ions are consumed from the plating bath solution can be equal to about the rate at which the metal atoms plate the cathode via the current flowing through the circuit. Ions in the solution bath may be replenished by manual and/or automated liquid additions of dissolved metal ions to the plating bath solution.

Figure 3:
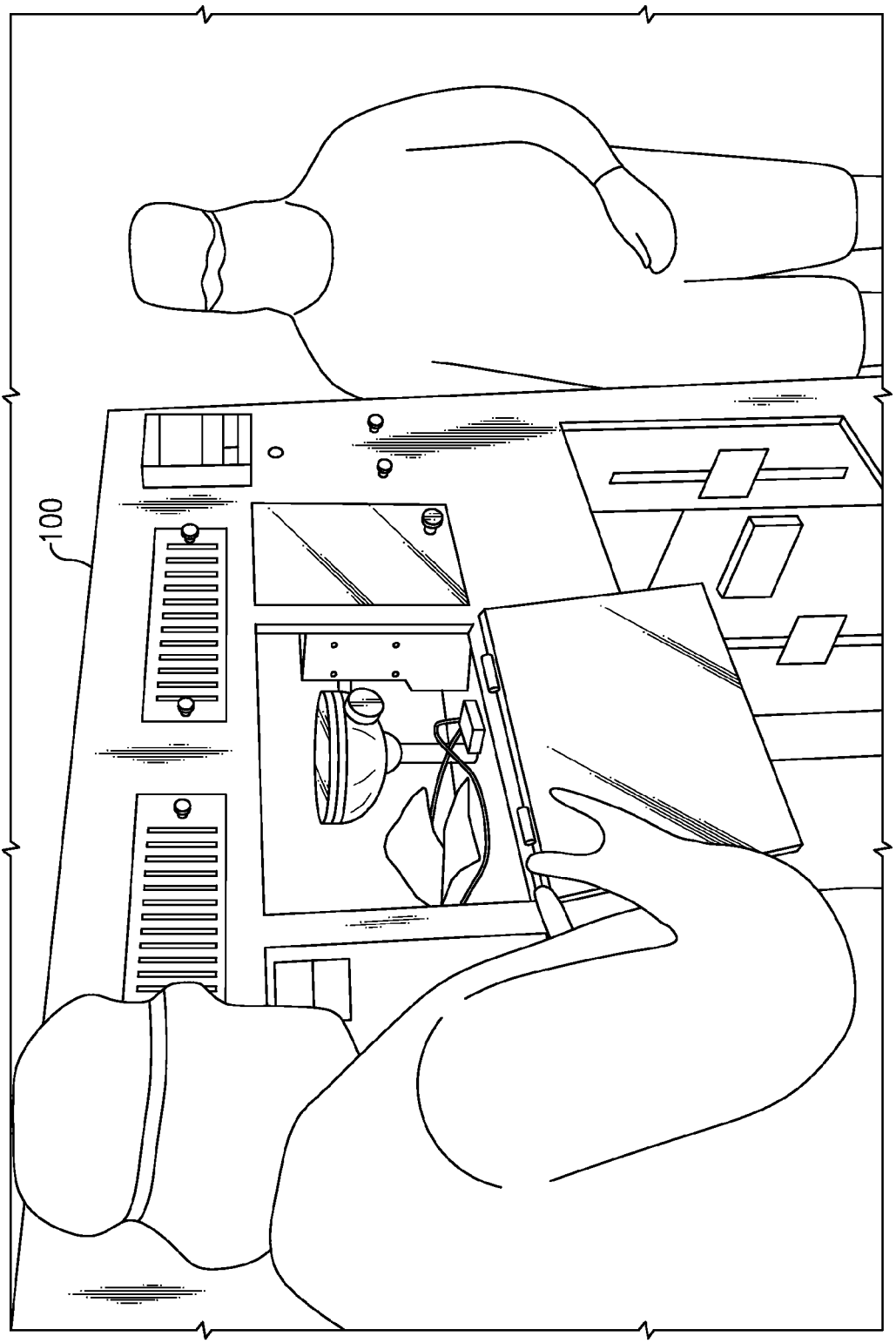
FIG. 3 illustrates a plating tool for uniform metal plating of a substrate, such as a wafer.

FIG. 3 illustrates an example plating tool 100 for uniformly plating a metal over a substrate, such as a wafer. The plating tool 100 can be used, for example, at block 17 of the process provided in FIG. 1. A variety of metals can be plated onto the substrate with the plating tool 100. Non-limiting examples of metals the plating tool 100 may plate onto a substrate include gold and copper. As illustrated, the plating tool 100 includes a plating system within a plating chamber. The plating system may include an anode and a plating bath. In some instances, the plating tool 100 may include the Semitool Equinox Plating platform, the Semitool Raider Plating platform, and/or a modified version thereof. The plating tool 100 may implement any combination of features described later in connection with FIGS. 5A-8.

Plating Features of a Substrate

Figure 4A:
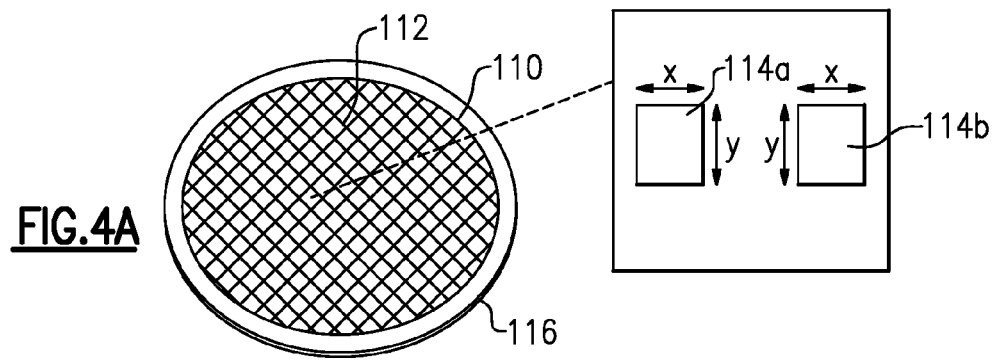
FIG. 4A illustrates a wafer with a plurality of dies that include features.
Figure 4B:
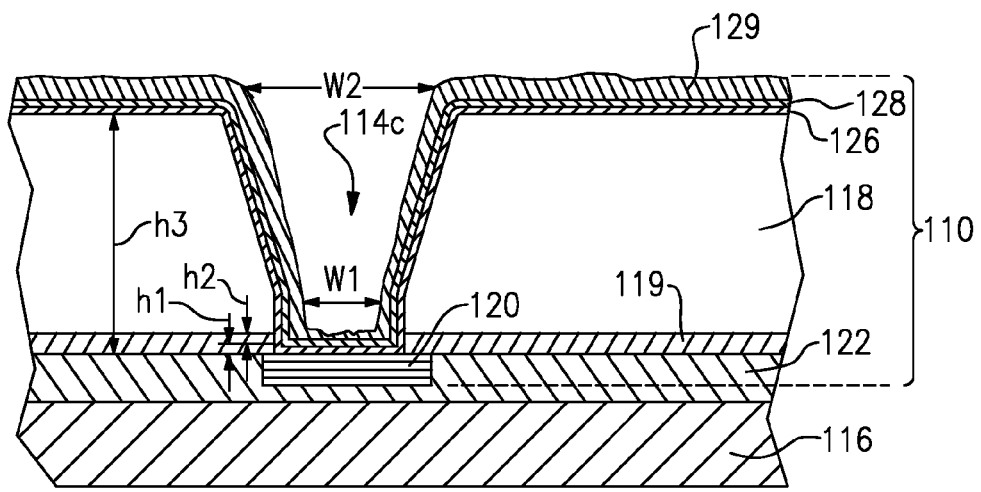
FIGS. 4B and 4C illustrate cross sections that show differences in uniformity of a metal layer plated onto a feature of the wafer illustrated in FIG. 4A.
Figure 4C:
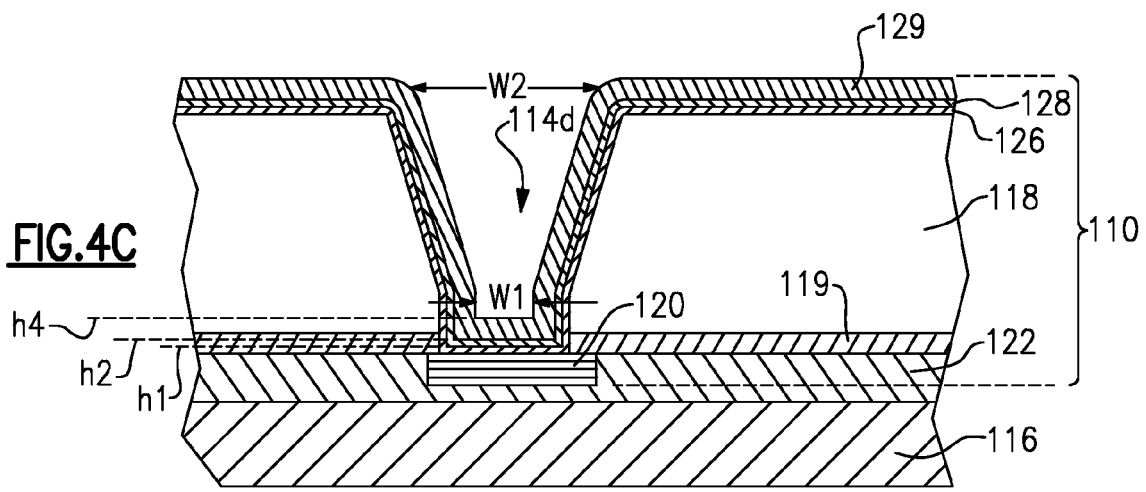

FIGS. 4A, 4B, and 4C illustrate an example of a feature that may be plated by the plating tool 100 and/or any of the plating systems described herein. FIG. 4A illustrates a wafer 110 with a plurality of dies 112 that include features 114a, 114b. It can be desirable for each feature on a wafer to have a substantially uniform plating thickness. However, in some instances, some features on the same wafer have a plating thickness that is different than other features. These different plating thicknesses can lead to different electrical characteristics, such as resistance. FIGS. 4B and 4C illustrate differences in uniformity of a metal layer plated onto features of the wafer 110. FIGS. 4B and 4C can correspond to substantially similar features at different positions of the wafer 110. For example, FIG. 4B may illustrate plating of a feature near the center of the wafer 110 and FIG. 4C may illustrate plating of a feature near the edge of the wafer 110.

FIG. 4A is a schematic plan view of a wafer 110. The wafer 110 includes features 114a, 114b, which may be formed, for example, by a semiconductor etcher, such as a plasma etcher. The wafer 110 can be, for example, a GaAs wafer having a diameter of at least about 6 inches. The wafer 110 can have a variety of crystal orientations. In some instances, the wafer 110 can have a (100) crystal orientation. The wafer 110 can be thinned to a relatively small thickness, such as a thickness less than about 200 μm. In certain embodiments, the wafer 110 can be bonded to a carrier substrate 116, such as a sapphire substrate, to aid in processing the wafer 110 for plating. For example, the carrier substrate 116 can provide structural support to a thinned wafer, thereby helping to prevent breakage or other damage to the wafer 110. The carrier substrate 116 can implement any combination of features of the carrier 40 illustrated in FIG. 2.

The features 114a, 114b can be, for example, vias, alignment marks, test structures, or other formations. For example, as will be described later with reference to FIGS. 4B and 4C, the features 114a, 114b can include through-wafer vias. The features 114a, 114b can have a length x of approximately 20 μm to about 80 μm. The features 114a, 114b can have a width y of approximately 30 μm to about 100 μm. In some implementations, the features 114a, 114b may be approximately the same size, and in other implementations the features 114a, 114b may have different sizes. While the features 114a, 114b illustrated in FIG. 4A can be rectangular when viewed from above, some features may be oval, circular, or other suitable shapes. In order to plate the features 114a, 114b using the plating tool 100, plating solution may need to reach a bottom surface of the through-wafer via with sufficient metal ions to uniformly plate the through-wafer via.

Certain features may be more difficult to plate than others. For example, features that extend relatively deep into the wafer, such as through-wafer vias, may be difficult to uniformly plate compared to relatively shallow features. Furthermore, plating a wafer with features having a relatively large surface area may also present obstacles, and some parts of a wafer may encounter less uniform plating than other parts of the wafer. For example, depletion of ions can lead to difficulties in plating relatively deep features located near the center of a wafer. Thus, plating certain features, such as through-wafer vias can present unique challenges for achieving plating uniformity.

FIG. 4B is a partial cross section the wafer 110 of FIG. 4A that includes a through-wafer via 114c, which is a side view cross section example of a feature 114a, 114b. The wafer 110 may include a substrate 118, epitaxial layer(s) 119 and a conductive layer 120. An adhesive 122 may be provided on a first surface of the wafer 110, and can be used to bond a carrier substrate 116 to the wafer 110. The adhesive 122 can be, for example, any suitable polymer or wax.

Seed layers may be formed over the substrate 118. A first seed layer 126 may be formed above the substrate 118, for example, via a first sputtering process. The first seed layer 126 may include, for example, nickel vanadium. A thickness $h_1$ of the first seed layer 126 may be approximately 300 Angstroms to about 1500 Angstroms. A second seed layer 128 may be formed over the first seed layer 126, for example, via a second sputtering process. The second seed layer 128 may include, for example, gold and may have a thickness $h_2$ of approximately 300 Angstroms to about 1500 Angstroms. The first seed layer 126 and the second seed layer 128 can be used to initiate the plating process.

The wafer 110 can be, for example, a GaAs wafer having a diameter greater than at least about 6 inches. The wafer 110 can have a variety of thicknesses, including, for example, a thickness ranging between about 50 μm to about 200 μm, for example, about 200 μm. As shown in FIG. 4B, the wafer 110 can be bonded using the adhesive 122 to the carrier substrate 116, which can be, for example, a sapphire substrate having a diameter larger than that of the wafer 110. However, in certain embodiments, the carrier substrate 116 and the adhesive 122 need not be included.

The epitaxial layer 119 may be formed on a first surface of the wafer 110, and can include, for example, a sub-collector layer, a collector layer, a base layer and/or an emitter layer to aid in forming HBT transistor structures. The wafer 110 can include additional layers, such as one or more layers configured to form BiFET devices. The epitaxial layer 119 can have, for example, a thickness ranging between about 15000 Angstroms to about 25000 Angstroms, or about 1.5 to 2.5 μm. Although the wafer 110 is illustrated as including the epitaxial layer 119, in certain embodiments, the epitaxial layer 119 can be omitted.

As illustrated, the wafer 110 includes the conductive layer 120, which can be any suitable conductor, including, for example, gold. A portion of the conductive layer 120 can be positioned below the through-wafer via 114c, so as to permit a subsequently deposited conductive layer to make electrically contact between the first and second surfaces of the wafer 110. In one embodiment, the wafer 110 includes a plurality of transistors formed on the first surface of the wafer 110 and a conductive ground plane formed on the second surface of the wafer 110, and the through-wafer via 114c is used to provide an electrical path between the transistors and the conductive ground plane.

The through-wafer via 114c can define a cavity in the wafer 110 having a top and a bottom, where the area of the bottom is less than the area of the top. For example, the through-wafer via 114c can include a bottom in the wafer 110 having a width $W_1$ and a length $L_1$ and a top having a width $W_2$ and a length $L_2$, where $W_2$ is greater than $W_1$ and $L_2$ is greater than $L_1$. In one embodiment, $W_2$ ranges between about 15 μm to about 140 μm, $L_2$ ranges between about 30 μm to about 160 μm, $W_1$ ranges between about 10 μm to about 130 μm, and $L_1$ ranges between about 20 μm to about 130 μm. Although FIG. 4B is illustrated for the case of first and second openings having a cross-section that is substantially rectangular in shape, the through-wafer via 125 can have openings of any of a variety of shapes, including for example, oval, circular, or square shapes. In certain embodiments, the cross-section of the first opening can have an area ranging between about 200 μm² to about 16,900 μm², and cross-section of the second opening can have an area ranging between about 450 μm² to about 22,400 μm². The height of the via can be relatively large. In one embodiment, the height $h_3$ of the via is in the range of about 50 μm to about 200 μm, for example.

Sidewall etching of a photoresist layer during an etching process can reduce the anisotropy of the through-wafer via 114c, and can result in the through-wafer via 114c having sloped sides. A portion of the through-wafer via 114c can have sides that are substantially perpendicular with respect to the surface of the wafer 110. In one embodiment, a height of the substantially perpendicular sides ranges between about 1 μm to about 15 μm.

The sloped sides can help prevent some issues with plating substantially vertical sidewalls. With the vertical sides it can be difficult for plating solution to reach a bottom surface of the through-wafer via 114c above a seed layer due to the narrow via opening limiting metal ion replenishment. Metal ions in the plating solution may be consumed as plating solution travels along the vertical sidewalls to the bottom of the through-wafer via 114c. This may leave insufficient metal ions in the plating solution for the surface area of the bottom of the through wafer via to be uniformly plated.

A metal 129, such as gold, may be plated over the through-wafer via 114c and any intervening seed layer(s). The metal 129 may provide electrical connections from a power rail, such as a ground plane, to the conductive layer 120. A thickness $h_4$ of the metal 129 above the conductive layer 120 when plated relatively uniformly can range from approximately less than 1 μm to approximately 7.5 μm. If the layer of metal 129 formed over the seed layer(s) is relatively non-uniform, the resistance and inductance of the connection between the conductive layer 120 and the power rail may increase. This can weaken the electrical connection from the conductive layer 120 to the power rail, thereby reducing the effect of some of the advantages of using the through-wafer via. For example, one of the reasons for including the through-wafer via 114c may be to provide a strong electrical connection from the conductive layer 120 to the power rail in order to decrease ground bounce, inductance effects, drops in the power rail at a device terminal, and/or other undesirable effects.

FIG. 4B illustrates a through-wafer via 114c with a layer of metal 129 that is thinner and relatively non-uniform. As illustrated, the metal 129 has a varying thickness above the conductive layer 120. This may result in undesirable additional resistance and/or inductance effects. In contrast, FIG. 4C illustrates a through-wafer via 114d with substantially the same structure, except for better uniformity of the metal 129, which can aid in producing a more reliable and higher performance part. The through-wafer vias 114c, 114d may be on different positions of the same wafer, illustrating that some through-wafer vias may plate less and less uniformly than other through-wafer vias on the same wafer. The plating systems and methods described in reference to FIGS. 5A-8 may plate features, such as through-wafer vias, uniformly on each die of a wafer as illustrated in FIG. 4C, rather than producing the undesirable results illustrated in FIG. 4B.

Plating through-wafer vias can include plating a relatively large surface area of a wafer and using a relatively large amount of plating solution, which may include expensive materials, such as gold. In one embodiment, each through-wafer via 114c, 114d has a surface area ranging between about 6000 μm² to about 9000 μm², and the total number of through-wafer vias on a wafer 110 is in the range of about 800 to about 23,000. The total surface area of through-wafer vias plated per wafer can range between about 140 mm² to about 4000 mm², in some instances.

As wafers become larger, problems with uniformity of plating through-wafer vias may become more difficult to overcome. In order to efficiently process wafers at a relatively fast rate, sufficient metal ions may need to be provided throughout the surface of the through-wafer vias on the wafer. Thus, the plating of these features can exacerbate limitations of conventional plating methods when plating a relatively large surface area of material over a relatively large wafer. Previous plating systems of plating tools may have been designed for plating smaller surface areas on smaller wafers, and thus may not be able to plate larger wafers with sufficient metal ions to create uniform plating of each feature of a die. Moreover, the processing time of a wafer in a plating tool can be important for throughput of a fabrication facility, and thus, it may not be feasible to extend plating processing time for larger wafers using previous plating methods.

As shown in FIG. 4B, uniformly plating each through-wafer via on a wafer may be difficult. And as wafer size increases, issues with uniformity can become more difficult to overcome. Moreover, plating features such as the through wafer vias described in reference to FIGS. 4B and 4C can be time consuming.

Plating Systems

In some conventional plating systems, plating heads may include an anode post with an anode plate screwed into the top of the anode post for electrical continuity. The anode post and anode plate can be positioned inside a plating chamber and then submerged in plating solution. Fresh plating solution can enter the plating chamber through the bottom of the hollow anode post and then flow through several holes on an outer surface of the anode post near a closed top of the anode post under the anode plate. The solution can then flow around the anode plate to the substrate positioned above the anode plate. The substrate can be lowered and submerged into a plating bath that contains plating solution. The substrate can be electrically charged as a cathode to promote plating of the substrate. As metal is plated onto the substrate, fresh solution including metal ions can flow onto the substrate to replenish consumed metal ions. This conventional plating system may be configured to plate gold onto a GaAs wafer.

Plating systems with this conventional plating head design have encountered problems related to maintaining uniform plating thickness across an entire substrate, especially in features such as through-wafer vias, as described earlier with reference to FIGS. 4B and 4C. For example, plating thickness near the center of a substrate and at the bottom of a through-wafer via can be relatively thinner than the plating thickness for a corresponding structure near the edge of the substrate.

One factor for thinner plating near the center of the substrate may be that plating solution is supplied from around an outer edge of the substrate and flows inward against a centrifugal force generated by rotating the substrate. Another factor may be that an electric field may be higher at the outer edge of the substrate, causing metal, such as gold, in the plating solution to be consumed first near the edge of the substrate. When this plating solution travels near the center of a wafer and down to the bottom of a through-wafer via, it may be depleted of metal ions. Moreover, through-wafer vias on larger wafers may include imperfections on the bottom of the through-wafer via, such as pillars remaining in the through-wafer via after etching. Plating over these imperfections may create additional obstacles to plating solution flow and metal ion replenishment. The non-uniformity of plating near the center of the substrate is sometimes greater the longer a plating bath is used, because the density of a plating bath increases with age making it more difficult for metal ions to flow toward the center of the substrate. Furthermore, using the conventional plating method may be time consuming and add additional time to the process flow. Since metal ions begin being consumed at the outer edge of the substrate first, it may take a long time for sufficient metal ions to travel to the center of the substrate to plate features of the substrate, such as the through-wafer vias located near the center of the substrate. Problems relating to the depletion of ions can be exacerbated for features having a relatively large depth and narrow openings.

With advances in technology, larger wafers may be used in semiconductor manufacturing processes that include plating, such as the processes described above in reference to FIGS. 1 and 2. For example, 6-inch wafers may be processed instead of 4-inch wafers. The same manufacturing facility used to process previous wafers may be converted to process larger wafers, as manufacturing facilities are very expensive to build and time consuming to set up for production. Part of the conversion to modify a manufacturing facility for production of larger wafers may include modifying existing tools in the manufacturing facility, such as a plating tool, to accommodate a larger wafer size. For example, the conventional plating head design may be enlarged to plate larger wafers. By modifying existing tools, substantial costs associated with new equipment and modification of the manufacturing facility may be avoided.

As the size of wafers increases, issues with plating uniformity near the center of a substrate may become more severe when using a larger version of the conventional plating head design described earlier. For example, due to a larger wafer diameter, plating solution travels a longer distance from the outer edge to the center of the wafer, which may result in problems of a greater magnitude associated with plating thickness uniformity near the center of the wafer. This problem may be especially evident in wafers that include features, such as through-wafer vias, which extend relatively deep into the wafer. For such features, it can be particularly difficult to provide uniform plating over the feature. In addition, it can take a long time for sufficient plating solution to adequately plate the feature. This may result in increased plating time and/or consuming additional plating solution, which can be expensive, for example, when features are plated with gold. Plating uniformity may be outside of acceptable bounds for a larger portion of the substrate. Alternatively or additionally, plating near the center of the substrate may be less uniform for larger wafers than in smaller wafers using the conventional plating head design. In addition, the time for plating features near the center of a larger wafer may increase the time it takes for suitably plating features of the substrate near the center of the substrate.

Figure 5A:
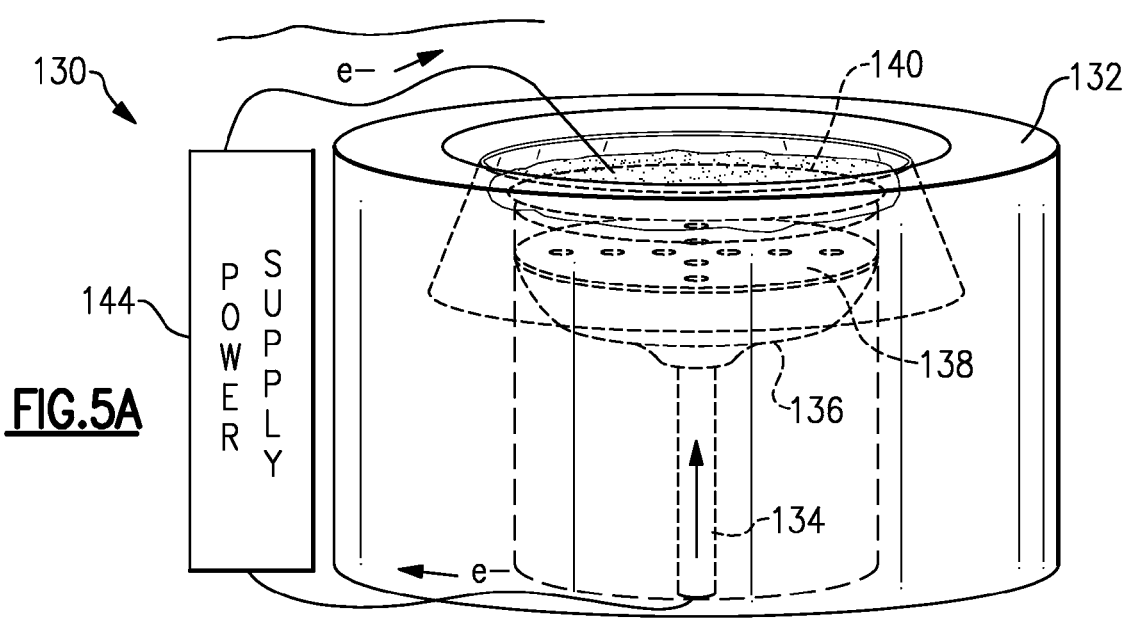
FIGS. 5A and 5B illustrate an example plating system according to one embodiment.
Figure 5B:
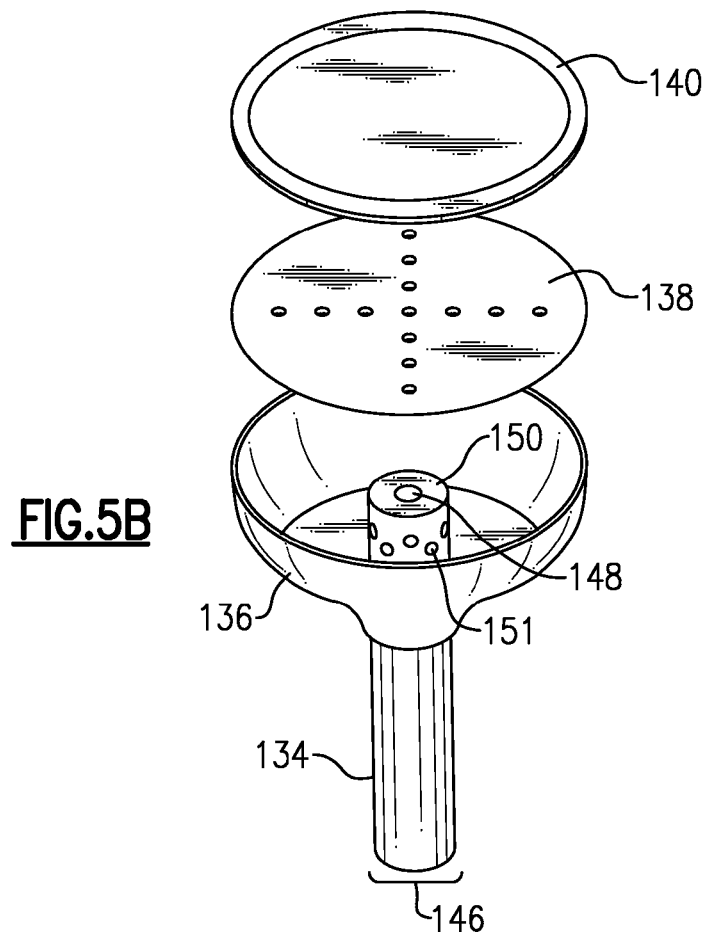

Different plating systems may be used to tackle the challenges associated with larger wafers. FIGS. 5A and 5B illustrate an example plating system 130 according to one embodiment. FIG. 5A illustrates the plating system 130 configured for plating, and FIG. 5B is an exploded schematic view that shows components of the plating system 130. The plating system 130 may include a plating chamber 132. An anode post 134, a showerhead body 136, a showerhead anode plate 138, and a cathode, such as a wafer 140, may be positioned within the plating chamber 132. The anode may include the anode post 134 and the showerhead anode plate 138. The anode plate 138 may be electrically coupled to the anode post 134. For example, the anode plate 138 can be screwed onto the top of the anode post 134, thereby providing an electrical connection. A power supply 144 may be coupled to the anode post 134 and the wafer 140. The power supply 144 can supply a current to the anode, such as a direct current, which may reduce the metal atoms where the plating solution meets the wafer 140, such that they plate the wafer 140. The plating solution may include gold ions in some instances.

The anode post 134 can be made of electrically conductive metal(s), for example, platinum plated titanium. The anode post 134 may be a hollow cylindrical structure. The anode post 134 may have a length from approximately 10 inches to 14 inches, with an inner diameter of approximately ⅜ inch to ¾ inch. A bottom 146 of the anode post 134 may include an opening that can allow plating solution to pass though the anode post 134, for example, as illustrated by the arrow in FIG. 5A. The anode post 134 may also include an opening 148 on a top surface 150. By including the opening 148, plating solution can reach the center of the wafer 140 directly. The opening 148 may be circular in shape with a diameter from approximately 5 mm to 20 mm. The anode post 134 may also include a plurality of holes 151 near the top 150 to allow the showerhead body 136 to fill with solution. In some instances, the top 150 of anode post 134 can be in direct electrical and physical contact with the showerhead anode plate 138.

The plating solution may flow through the opening 148 of the anode post 134 into the showerhead body 136. More details regarding the showerhead body 136 will be provided later in connection with FIG. 7A.

The showerhead body 136 can be coupled to the showerhead anode plate 138. The term "showerhead anode plate" may refer to a portion of the anode of the plating circuit that includes an electrically conductive plate having a plurality of holes to dispense a liquid or gaseous solution. A major surface of the showerhead anode plate 138 can be circular in shape. The showerhead anode plate 138 and the showerhead body 136 may be secured to each other so as to create a seal for fluids. The seal may be sufficient to prevent a reduction of pressure in the plating solution flowing between the opening of the anode post 134 and the holes of the showerhead anode plate 138. In some instances, the showerhead anode plate 138 can include a plurality of equidistant holes and associated screws that can attach the showerhead anode plate 138 to the showerhead body 136. This is one way to ensure a good seal. Alternatively, other known methods of securing the showerhead anode plate 138 to the showerhead body 136 can be used to ensure a good seal. The showerhead anode plate 138 may also be easily removed without removing the showerhead body 136. This can allow for varying patterns and/or sizes of holes in the showerhead anode plate 138 to be used in different applications. For example, the same plating system may be used to plate different types of wafers, wafers with different types of features, and/or in connection with different plating solutions. In these non-limiting examples, a different showerhead anode plate 138 design may be used without changing the showerhead body 136 and/or other parts of the plating system 130.

The flow of plating solution onto the wafer 140 can be directed by the showerhead anode plate 138. In some implementations, the showerhead anode plate may have a thickness of approximately 2 mm to 3 mm. The showerhead anode plate 138 may be made of a variety of electrically conductive metals, for example, platinum plated titanium. In some instances, the showerhead anode plate 138 may be made of substantially the same material(s) as the anode post 134. In other embodiments, the showerhead anode plate 138 and the anode post 134 may be made of different material(s). A variety of patterns of holes, number of holes, and/or hole sizes may be used, depending on a number of factors. Such factors may include, but are not limited to, a particular plating solution being dispensed through the showerhead anode plate 138, features of a wafer 140 being plated, and/or characteristics of the wafer 140. More detail regarding the showerhead anode plate 138 will be provided later in connection with FIGS. 7B and 7C.

One or more features of the wafer 140 may be plated by the plating system 130. The wafer 140 may be, for example, a GaAs wafer as described in reference to FIGS. 1 and 2. The wafer 140 may be positioned just below a plating bath level. The wafer 140 may be titled by an angle of about 5 degrees relative to the showerhead anode plate 138. A portion of the GaAs wafer may include a HBT device, which may be a BiFET device and/or be at least part of a power amplifier. The one or more features may include vias, alignment marks, test structures, or other structures. In some instances, the one or more features include a through wafer via, for example, as described earlier in reference to FIGS. 4B and 4C.

Figure 6A:
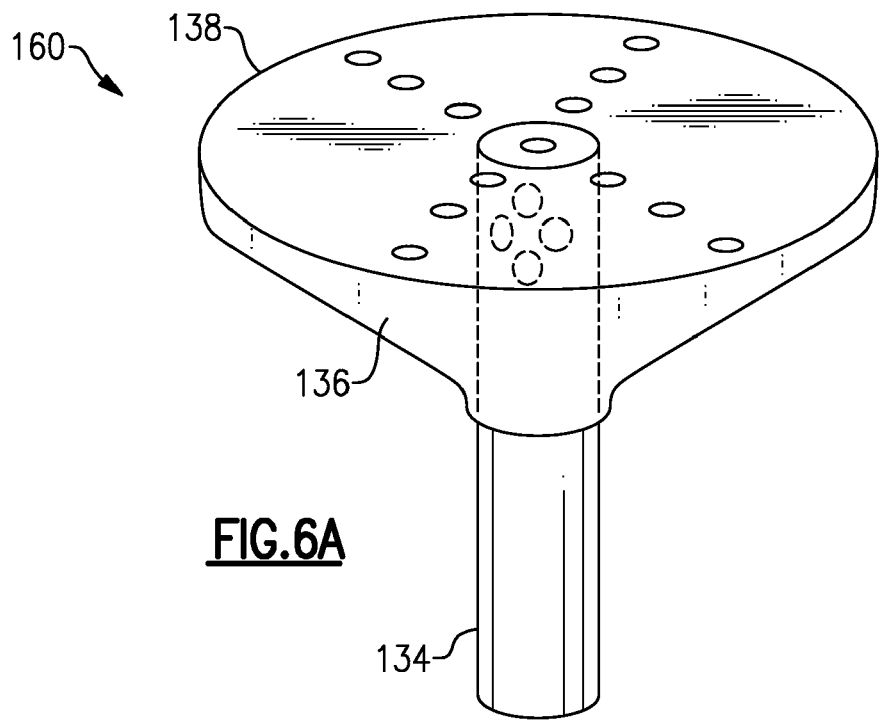
FIGS. 6A and 6B illustrate a plating head and a flow of plating solution through the plating head according to one embodiment.
Figure 6B:
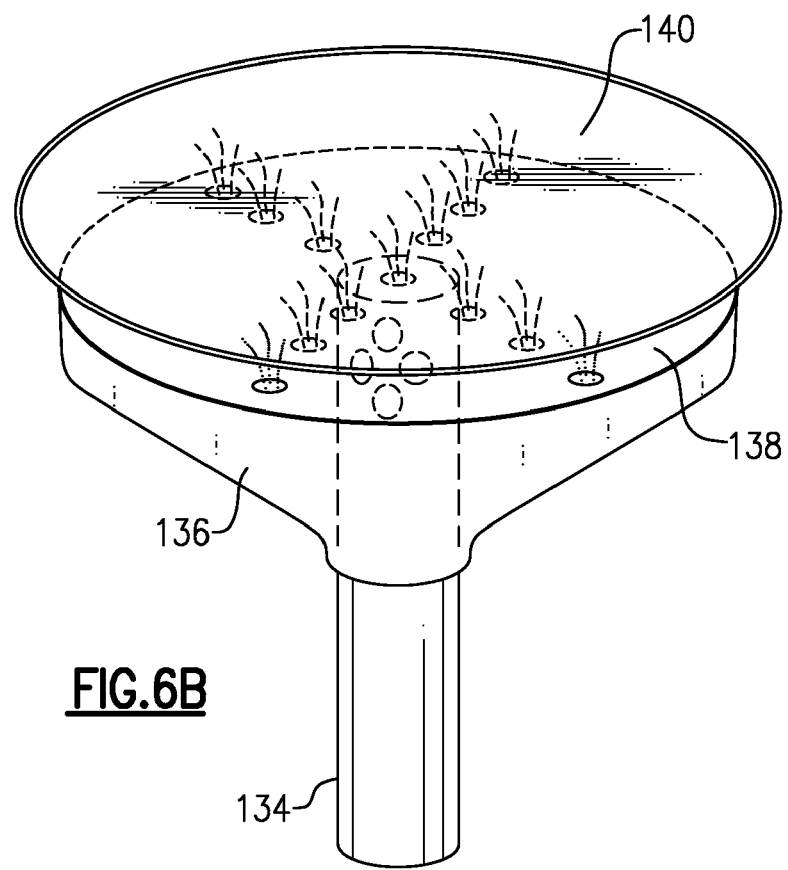

FIGS. 6A and 6B illustrate a plating head and a flow of plating solution through the plating head according to one embodiment. An anode design 160 includes the anode post 134, the anode showerhead plate 138, and the showerhead body 136 of FIGS. 5A and 5B. The anode design 160 can direct a flow of plating solution across a relatively large portion of a major plating surface of the wafer. In this way, metal ions in the plating solution may travel to features without first being consumed as the plating solution travels across the wafer. Plating solution can flow through an opening at the top of the anode post 134 into the showerhead body. Then the plating solution can flow through the holes of the showerhead anode plate 138 as shown in FIG. 6B. In this embodiment, plating solution flows only through holes of the showerhead anode plate 138 to the wafer 140. Plating solution does not flow out of the anode post 134 around the wafer 140 to plate the wafer 140 in the illustrated embodiment.

The showerhead anode plate 138 may include a plurality of holes sized for dispensing plating solution. The number, arrangement and/or size of holes may be specifically chosen for specific plating solutions. For example, holes may be specifically sized to dispense plating solution that includes gold. Holes sized for a particular plating solution, such as gold, may not adequately work for dispensing another plating solution, such as copper, in some implementations. Alternatively or additionally, holes may be tailored for specific wafers having particular features. For instance, particular holes in the showerhead anode plate 138 may be advantageous for plating GaAs having a diameter of 6-inches that includes 2-24 through-wafer vias per die.

Hole sizes and/or total surface area of holes may affect the flow of plating solution to a wafer. For example, holes with larger surface area may reduce the flow of plating solution onto the wafer. The flow of plating solution may also affect the force/pressure of plating solution sprayed on the wafer, with increased flow rates generally resulting in higher pressure plating solution reaching features of the wafer. As a result, size and placement of holes may have a significant impact the uniformity of metal plating. More details regarding holes of the showerhead anode plate will be provided later in connection in FIGS. 7B and 7C.

The anode design 160 can create a higher flow rate than some conventional designs. For instance, the plating solution may flow thorough the anode post 134 at a flow rate from approximately 0.5 gal/min to 5 gal/min. The pressure of plating solution sprayed through holes of the showerhead anode plate 138 can be controlled by, for example, adjusting the flow rate of plating solution and/or adjusting the size of the holes in the anode plate. Pressure can be inversely proportional to the size of the holes, so the holes can be sized such that a pressure equivalent to a flow rate higher than the pressure provided by pumps in some conventional plating systems can be achieved. This can lead to a higher flow rate at the plating surface of the wafer. The higher flow rate can be, for example, about 50% to 150% greater than some conventional designs. In some instances, plating solution may have a flow rate from approximately 0.75 gal/min to 7.5 gal/min or more when it reaches the wafer. The flow rate of the plating solution may depend on the anode hole size, number of holes, and/or pump flow rate setting. For example, the flow rate of the plating solution through holes of the showerhead anode plate 138 may depend on a ratio of the area of openings in the anode post 134 to the area of holes in the showerhead anode plate 138. Agitation created by this increased pressure can lead to better plating. The increased flow rate and/or increased pressure at the plating surface of the wafer can help create more uniform plating of features, such as through-wafer vias.

The wafer 140 may be rotated about the axis of the anode post 134. Rotation may be accomplished by any suitable means known in the art. A direction of rotation of the wafer can reverse at a fixed interval of time, for example, every 15 to 40 seconds, in some implementations. The wafer may be rotated at a rate of approximately 30 RPM to 120 RPM. In some implementations, the wafer may be rotated at a rate of about 1 revolution per second. In such an implementation, a feature on the wafer may pass by a hole of the showerhead anode plate 138 approximately 4 times every second when the holes are arranged in a cross pattern on the showerhead anode plate 138, for example, as illustrated in FIG. 7B. Rotating the wafer in relation to the showerhead anode plate 138 may lead to a refresh rate of plating solution that can ensure that the plating process is not limited by insufficient metal ions in the plating solution. Rotating the wafer while dispensing plating solutions through the showerhead anode plate 138 may also prevent the centrifugal force of the wafer from leaving the center of the wafer with insufficient plating solution. In some implementations, a direction of rotation can change at a fixed interval of time. The fixed interval of time can be selected from a range of every 15 to 40 seconds.

Plating may also be more uniform using the plating system 160, compared to previous designs. A metric to measure uniformity of plating may be plating thickness uniformity on a backside of wafer and/or plating thickness uniformity over a feature, such as inside through-wafer vias. In some instances, plating uniformity on the backside of the wafer can be from approximately 1% to 4%.

Due to a number of advantageous features of the anode design 160, the speed of plating can be increased using the anode design 160. For example, some conventional plating systems took from approximately 24 minutes to 30 minutes to suitably plate a 6-inch wafer having 2 to 5 through-wafer vias per die with gold. In some instances, the anode design 160 has plated a substantially similar wafer in about approximately 20 minutes to 23 minutes.

Figure 7A:
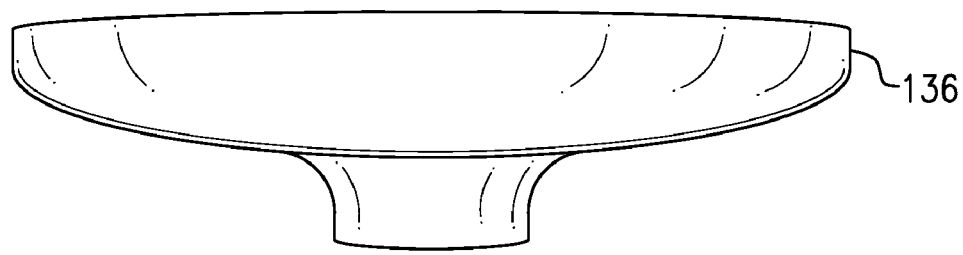
FIG. 7A provides an example of a showerhead body and FIGS. 7B and 7C provide example showerhead anode plates.
Figure 7B:
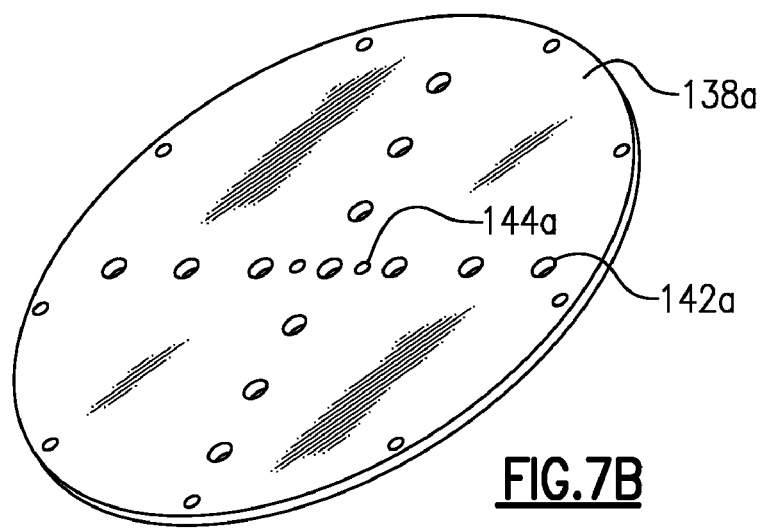
Figure 7C:
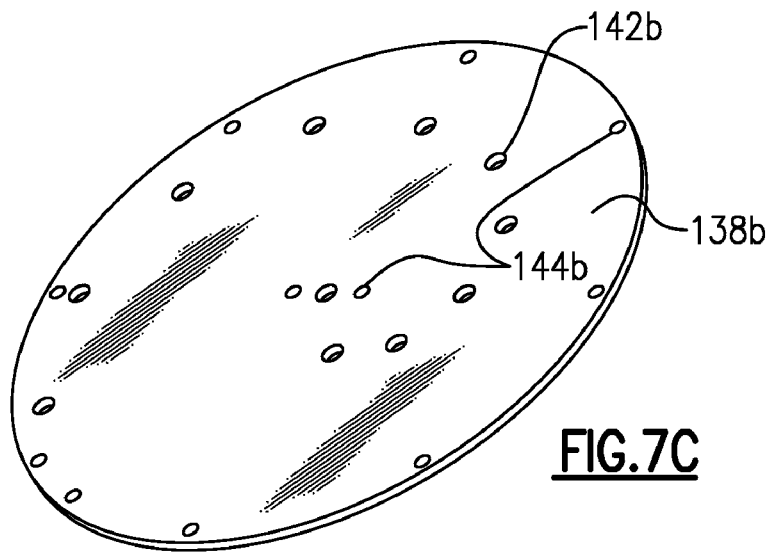

FIG. 7A provides an example of the showerhead body 136 and FIGS. 7B and 7C provide example showerhead anode plates 138a, 138b. Although FIGS. 7B and 7C describe two example showerhead anode plates 138a, 138b, the principles described in connection with these figures may be applied to a variety of different arrangements of holes.

An example showerhead body 136 is provided in FIG. 7A. In some implementations, the showerhead body 136 may be made of polypropylene. The showerhead body 136 may be shaped so as to reduce eddy currents, which could reduce flow rate, from forming in corners. Advantageously, the showerhead body 136 may be substantially smooth and rounded, rather than rectangular in shape, so as to reduce eddy currents. The showerhead body 136 may be substantially rounded and expand in diameter from a bottom positioned near a top of an anode post to a top configured to receive a showerhead anode plate. With reference to FIGS. 5B and 7A-7C, a first opening of the showerhead body 136 may be sized to securely mate with the anode post 134 such that plating solution does not leak around the first opening of the showerhead body 136. A second opening may be sized to hold a showerhead anode plate, such as showerhead anode plates 138a, 138b. The showerhead body 136 may be shaped similar to a funnel, a cup, and/or a bowl. The shape of the showerhead body 136 may help to optimize a flow rate of plating solution onto the wafer 140.

The example showerhead anode plate 138a of FIG. 7B illustrates a cross pattern of holes 142a. The showerhead anode plate 138a may include a plurality of holes 142a for dispensing plating solution and a plurality of mounting holes 144a. The plurality of mounting holes 144a can be used for suitably mounting the showerhead anode plate 138a to other elements, such as the showerhead body 136 and/or the anode post 134. While plating solution is being dispensed through holes 142a, mounting holes 144a may be blocked so as to prevent plating solution from flowing therethrough. As illustrated, the mounting holes 144a are smaller than the holes 142a.

The showerhead anode plate 138a may have a circular major surface. In some implementations, a diameter of the showerhead anode plate 138a can be about 6 inches. Although the illustrated showerhead anode plate 138a includes 13 circular holes 142a, in other implementations the showerhead anode plate 138a may have a different number of holes, such as 4, 5, 8, 9, 12, or more holes. Holes 142a need not be circular in all implementations; holes 142a may also be rectangular, oval, and/or other suitable shapes. Each of the 13 illustrated holes 142a can have a diameter of about 3.5 mm. While the holes 142a have substantially the same size in the illustrated embodiment, in other implementations the holes 142a are not all the same sizes. For example, the center hole may be smaller than the other holes. As another example, holes farther from the center hole may have a larger diameter to account for a different distance from an opening of an anode post through which plating solution flows into a showerhead body. The total surface area of holes 142a compared to the surface area of a major surface of the showerhead anode plate 138a may influence plating performance. In some instances, the total surface area of holes 142a may be approximately 0.7% of the surface area of a major surface of the showerhead anode plate 138a. In some implementations, hole sizes may be sized based on an opening in an anode post that opens into a showerhead body.

One hole can be positioned in the center of a major surface of the showerhead anode plate 138a. In the illustrated embodiment, the cross pattern may include two lines of 6 holes across the diameter of the showerhead anode plate 138a plus the center hole; the two lines can intersect at the center hole. Each hole in the two lines can be spaced approximately the same distance from the closest hole(s) in the line, in some implementations. In other implementations, holes spacing on different arms may be offset so that when the wafer rotates, the hole locations do not overlap at the same wafer radius. The showerhead anode plate 138a can be divided into four sections of about equal area by the holes 142a. The four lines beginning at the center of the showerhead anode plate 138a and extending to the outer edge of the showerhead anode plate 138a may include holes 142a that are about evenly spaced. The cross pattern shown in FIG. 7B may allow each feature on a major plating surface of a wafer to be sprayed with plating solution four times each time the wafer is rotated. This may help achieve uniform plating in flow limited applications, such as plating relatively deep vias, by providing multiple opportunities per rotation to pulse the plating solution at each position on the wafer, such as into the deep vias.

The pattern of holes 142a of the showerhead anode plate 138a may also result in a particular plating uniformity pattern on a wafer that is plated using the showerhead anode plate 138a. The plating uniformity pattern resulting from a cross pattern of holes may include concentric rings around of the wafer. The concentric rings may correspond to locations where holes 142a spray plating directly over a major surface of the wafer. This pattern may be detected, for example, using a number of resistance measurements at different locations of the wafer. Although the plating uniformity map may have a low variation of resistance or other parameter values, a signature of concentric rings in the plating uniformity pattern may be detected when a showerhead plate 138a with a cross pattern of holes 142a is used to plate a wafer. A plating uniformity pattern, such as a plating uniformity resistance profile, may help to adjust uniformity within a target range, for example, before a tool is related back to production after a plating head has been adjusted.

The showerhead anode plate 138b of FIG. 7C illustrates a spiral pattern of holes 142b. The showerhead anode plate 138b may include a plurality of holes 142b for dispensing plating solution and a plurality of mounting holes 144b. The plurality of mounting holes 144b can be used for suitably mounting the showerhead anode plate 138b to other elements, such as the showerhead body 142 and/or the anode post 134. While plating solution is being dispensed through holes 142b, mounting holes 144b may be blocked so as to prevent plating solution from flowing therethrough. As illustrated, the mounting holes 144b are smaller than the holes 142b.

The showerhead anode plate 138b may have a circular major surface. In some implementations, a diameter of the showerhead anode plate 138b can be about 6 inches. Although the illustrated showerhead anode plate 138b includes 11 circular holes 142b, in other implementations the showerhead anode plate 138b may have a different number of holes 142b. Holes 142b need not be circular in all implementations; holes 142b may also be rectangular, oval, and/or other suitable shapes.

As illustrated, the showerhead anode plate 138b includes 11 circular holes 142b. Each hole 142b can have a diameter of about 2 mm to 8 mm. This can allow the holes 142b to have substantially the same area through which to spray plating solution as the 13 holes 142a of the cross pattern. While the holes 142b have substantially the same size in the illustrated embodiment, in other implementations the holes 142b are not all the same sizes. For example, the center hole may be smaller than the other holes. As another example, holes farther from the center hole may have a larger diameter to account for a different distance from an opening of an anode post through which plating solution flows into a showerhead body. The total surface area of holes 142b compared to the surface area of a major surface of the showerhead anode plate 138b may influence plating performance. In some instances, the total surface area of holes may be approximately 0.7% of the surface area of a major surface of the showerhead anode plate 138b. In some implementations, hole sizes may be sized based on an opening in an anode post that opens into a showerhead body.

One hole can be positioned in the center of a major surface of the showerhead anode plate 138b. The remaining holes of the spiral pattern may evenly divide the showerhead anode plate 138b into sections along lines from each hole 142b to the center of the showerhead anode plate 138b. The spiral pattern shown in FIG. 7C may allow different positions of a wafer to be sprayed with plating solution as the wafer rotates in relation to the showerhead anode plate 138b.

The pattern of holes 142b of the showerhead anode plate 138b may also result in a particular plating uniformity pattern on a wafer that is plated using the showerhead anode plate 138b. The plating uniformity pattern may evidence that a spiral pattern of holes 142b was used to plate a wafer.

Figure 8:
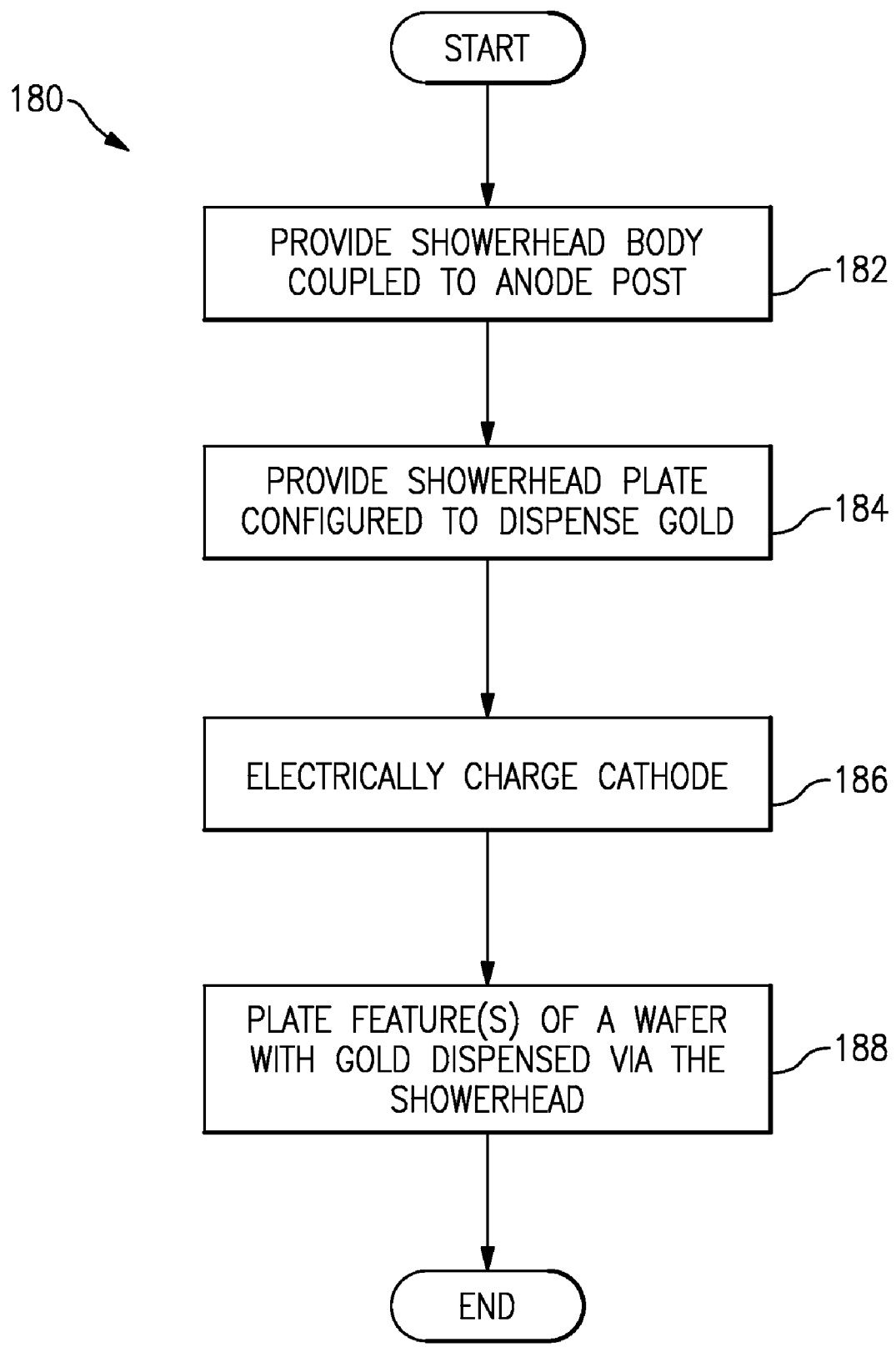
FIG. 8 is a flowchart of a process for uniform metal plating features of a wafer, according to an embodiment.

Referring to FIG. 8, a flowchart of a process 180 is provided for uniform metal plating of features of a wafer in accordance with one embodiment. The process 180 may use a plating system that includes any combination of features of the plating systems described herein, such as the plating system 130. Any combination of the features of process 180 may be embodied in a non-transitory computer readable medium and stored in non-volatile computer memory. When executed, the non-transitory computer readable media may cause some or all of the process 180 to be performed. It will be understood that the methods discussed herein may include greater or fewer operations and the operations may be performed in any order, as necessary.

The process 180 may begin at block 182 in which a showerhead body coupled to an anode post is provided. These components may be included in a plating system of a plating tool, for example, the plating system 130 as described earlier. For example, the showerhead body may correspond to the showerhead body 136 described earlier. Alternatively or additionally, the anode post may correspond to the anode post 134 described earlier. The anode post may be a metallic cylinder with a hollow center. The post may include a hole at a top end that opens into the showerhead body. The showerhead body may have a relatively smooth contour. The showerhead body may be shaped with a circular outer edge that generally increases in diameter as the distance from the anode post increases. The showerhead body may be configured to securely receive the anode post, forming a seal that can prevent leakage of plating solution around the outer diameter of the body of the anode post. The anode post may also include multiple holes at the sides near the top to allow the showerhead to fill with solution.

A showerhead anode plate may be provided at block 184. The showerhead anode plate may include any combination of features described earlier in reference to showerhead plates, for example, showerhead anode plates 138, 138a, 138b. For instance, the showerhead anode plate may include holes sized specifically for dispensing plating solution that includes gold ions. In some implementations, the holes are also specifically sized to dispense plating solution onto a GaAs wafer having a diameter of at least about 6-inches that includes through-wafer vias. The through-wafer via may include any combination of features of the through-wafer vias described earlier in reference to FIGS. 4B and 4C. The holes of the showerhead anode plate may be arranged in a variety of patterns, for example, the cross patterns or the spiral pattern illustrated in FIGS. 7B and 7C, respectively. In one specific embodiment, the showerhead anode plate may include 13 holes arranged in a cross pattern with one of these holes positioned at about the center of the showerhead anode plate, as illustrated in FIG. 7B. The showerhead anode plate may be coupled to the showerhead body so as to form a seal preventing plating solution to leak out of the showerhead body and/or decrease in pressure of the plating solution. This arrangement may allow for plating solution to flow through the anode post at a rate of approximately 12 gal/min or more. Plating solution may later be dispensed through at least one hole of the showerhead anode plate at an effective rate of approximately 7.5 gal/min or more.

Next, a cathode, which may include a wafer, may be electrically charged at block 186. For example, a power supply can apply a direct current to a wafer. This can result in plating solution flowing through the anode post into the shower head body. Plating solution may be dispensed through at least one hole of the showerhead anode plate onto a plating surface of the cathode, as described earlier.

The method 180 continues at a block 188, in which features of a wafer may be plated with metal dispensed via the showerhead anode. During plating, the wafer may be rotated. For example, the wafer may be rotated at a rate of approximately 60 revolutions per minute. In this example, points on the wafer may be sprayed with fresh plating solution 4 times per second with a showerhead anode plate with holes arranged in a cross pattern. In some implementations, at least one through-wafer via of a GaAs wafer may be plated with gold in the process 180. Such plating can produce a layer of gold in the through-wafer via that is approximately 1 um to 3 um thick, having a wafer backside thickness uniformity of approximately 1% to 6%. Alternatively or additionally, a direction of wafer rotation may be reversed at a fixed interval of time during plating. The fixed interval of time may be chosen from a range of every 15 to 40 seconds.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus for plating one or more features of a GaAs wafer with gold, the apparatus comprising:
   an anode including an anode post and a showerhead anode plate, the anode post having at least one opening for providing a gold plating solution, and the showerhead anode plate having holes sized to dispense the gold plating solution onto the GaAs wafer; and
   a showerhead body coupled to the anode post and the showerhead anode plate, the showerhead body configured to create a seal sufficient to substantially prevent a reduction of pressure in the gold plating solution flowing from the anode post and the holes of the showerhead anode plate.

2. The apparatus of claim 1, further comprising a rotatable substrate holder configured to hold a substrate substantially parallel to a major surface of the showerhead anode plate.

3. The apparatus of claim 2, wherein the substrate includes a sapphire carrier bonded to the GaAs wafer, and wherein the substrate holder is configured to hold the sapphire carrier.

4. The apparatus of claim 2, wherein the rotatable wafer holder is configured to rotate at a rate of at least one rotation per second and to reverse a direction of rotation at a predetermined interval of time during plating.

5. The apparatus of claim 1, wherein the holes of the showerhead anode plate are configured to dispense the plating solution at a flow rate of at least about 6 gallons per minute.

6. The apparatus of claim 1, wherein the holes of the showerhead anode plate are sized for dispensing the plating solution onto the GaAs wafer having a diameter of at least about 150 mm.

7. The apparatus of claim 1, wherein the showerhead anode plate has a diameter of at least about 150 mm.

8. The apparatus of claim 1, wherein the showerhead body comprises polypropylene.

9. The apparatus of claim 1, wherein the showerhead anode plate comprises platinum and titanium.

10. The apparatus of claim 1, wherein the showerhead body has a diameter that increases from a point at which the showerhead body contacts the anode post to another point at which the showerhead body contacts the showerhead anode plate.

11. A method of plating one or more features on a GaAs wafer, the method comprising:
   providing a showerhead body coupled to an anode post, the anode post having an opening at a first end that opens into the showerhead body;
   providing a showerhead anode plate coupled to the showerhead body, the showerhead anode plate having holes configured to dispense a plating solution, and the showerhead anode plate electrically coupled to the anode post;
   electrically charging a cathode that includes the GaAs wafer; and
   plating the one or more features of the GaAs wafer with gold dispensed from the holes of the showerhead anode plate.

12. The method of claim 11, wherein at least one of the one or more features has a depth that is at least about five times the width at the narrowest point of the at least one feature.

13. The method of claim 11, wherein at least one of the one or more features includes a through-wafer via.

14. The method of claim 11, wherein at least one of the one or more features has a depth of at least about 50 microns.

15. The method of claim 11, wherein the GaAs wafer has a diameter of at least about 150 mm.

16. The method of claim 11, wherein the showerhead anode plate includes holes arranged in a cross pattern.

17. The method of claim 11, wherein the plating includes plating features having a depth of least about 50 microns on a wafer that is at least about 150 mm in diameter to a backside plating thickness uniformity of within approximately 4%.

18. The method of claim 11, further comprising rotating the GaAs wafer at a rate of at least one rotation per second during the plating.

19. The method of claim 11, wherein the plating solution flows through the holes in the showerhead anode plate at a flow rate of at least about 7.5 gallons per minute.

20. A method of plating one or more through-wafer vias on a GaAs wafer having a diameter of at least about 150 mm, the method comprising:

dispensing a plating solution that includes gold through a plurality of holes of a showerhead anode plate, the plurality of holes arranged in a cross shape and sized for dispensing gold onto the GaAs wafer; and forming a uniform layer of gold over the one or more through-wafer vias, the uniform layer of gold having a thickness of at least about 1.5 um and a backside plating thickness uniformity within about 4%.

21. The method of claim 20, wherein the showerhead anode plate comprises platinum and titanium.

22. The method of claim 20, wherein the uniform layer of gold is formed over at least one seed layer.

23. The method of claim 20, wherein the plurality of holes includes a hole in the center of the showerhead anode plate and at least 8 more holes arranged in a cross shape on the showerhead anode plate.

24. A GaAs wafer comprising:

a circular major surface having a diameter of at least about 150 mm; and a layer of gold formed over features of the GaAs wafer to a backside plating thickness uniformity within about 4%, wherein a plating uniformity pattern of the GaAs wafer includes concentric rings around the GaAs wafer having a different characteristic than the remaining uniformity pattern of the GaAs wafer.

25. The GaAs wafer of claim 24, wherein the features include through-wafer vias.

26. The GaAs wafer of claim 24, wherein the concentric rings have a different resistance compared to the remaining portion of the GaAs wafer.

\* \* \* \* \*